United States Patent
Yamada et al.

(10) Patent No.: US 7,388,318 B2
(45) Date of Patent: Jun. 17, 2008

(54) THIN FILM PIEZOELECTRIC RESONATOR, THIN FILM PIEZOELECTRIC DEVICE, AND MANUFACTURING METHOD THEREOF

(75) Inventors: Tetsuo Yamada, Ube (JP); Kosuke Nishimura, Ube (JP); Keigo Nagao, Ube (JP)

(73) Assignee: UBE Industries, Ltd., Yamaguchi (JP)

( * ) Notice: Subject to any disclaimer, the term of this patent is extended or adjusted under 35 U.S.C. 154(b) by 340 days.

(21) Appl. No.: 10/518,704
(22) PCT Filed: Jun. 20, 2003
(86) PCT No.: PCT/JP03/07857

§ 371 (c)(1),
(2), (4) Date: Dec. 17, 2004

(87) PCT Pub. No.: WO04/001964

PCT Pub. Date: Dec. 31, 2003

(65) Prior Publication Data

US 2005/0248238 A1    Nov. 10, 2005

(30) Foreign Application Priority Data

Jun. 20, 2002    (JP) ............... 2002-179910

(51) Int. Cl.
*H01L 41/08* (2006.01)
(52) U.S. Cl. .................. 310/324; 310/365; 310/366
(58) Field of Classification Search .............. 310/324, 310/320
See application file for complete search history.

(56) References Cited

U.S. PATENT DOCUMENTS

| | | | | |
|---|---|---|---|---|
| 5,956,292 | A * | 9/1999 | Bernstein ............ | 367/140 |
| 6,215,375 | B1 * | 4/2001 | Larson et al. ......... | 333/187 |
| 6,556,103 | B2 * | 4/2003 | Shibata et al. ........ | 333/187 |
| 6,584,708 | B2 * | 7/2003 | Yun et al. ............ | 310/324 |
| 6,774,541 | B1 * | 8/2004 | Fukui ................ | 310/358 |
| 6,842,088 | B2 * | 1/2005 | Yamada et al. ........ | 333/187 |

FOREIGN PATENT DOCUMENTS

| JP | 58-153412 A | 9/1983 |
|---|---|---|
| JP | 58-156220 A | 9/1983 |
| JP | 60-142607 A | 7/1985 |
| JP | 02-313109 A | 1/1990 |
| JP | 2000-069594 A | 3/2000 |
| JP | 2000-307376 A | 11/2000 |
| JP | 2000-332568 A | 11/2000 |
| JP | 2001-203558 A | 7/2001 |
| JP | 2001-345656 A | 12/2001 |
| JP | 2002-076823 A | 3/2002 |
| JP | 2002-353760 A | 12/2002 |
| JP | 2003-133892 A | 5/2003 |

* cited by examiner

*Primary Examiner*—Mark Budd
(74) *Attorney, Agent, or Firm*—Frommer Lawrence & Haug LLP; Ronald R. Santucci

(57) ABSTRACT

A thin film piezoelectric device includes a substrate (12) having via holes (22) and a piezoelectric laminated structure (14) consisting of a lower electrode (15), a piezoelectric film (16), and an upper electrode (17) formed on the substrate (12) via an insulation layer (13). A plurality of thin film piezoelectric resonators (210, 220) are formed for the via holes (22). The piezoelectric laminated structure (14) includes diaphragms (23) located to face the via holes (22) and a support area other than those. The thin film piezoelectric resonators (210, 220) are electrically connected by the lower electrode (15). When the straight line in the substrate plane passing through the centers (1, 2) of the diaphragms (23) of the thin film piezoelectric resonators (210, 220) has the length D1 of the segment passing through the support area and the distance between the centers of the diaphragms of the thin film piezoelectric resonators (210, 220) is D0, the ratio D1/D0 is 0.1 to 0.5. The via hole (22) is fabricated by the deep graving type reactive ion etching method.

55 Claims, 10 Drawing Sheets

THIN FILM PIEZOELECTRIC RESONATOR, THIN FILM PIEZOELECTRIC DEVICE, AND MANUFACTURING METHOD THEREOF

This application is a 371 of PCT/JP2003/007857 filed on Jun. 20, 2003, published on Dec. 31, 2003 under publication number WO 2004/001964 A1 which claims priority benefits from Japanese Patent Application Number 2002-179910 filed Jun. 20, 2002.

TECHNICAL FIELD

The present invention relates to a thin film piezoelectric device prepared by combining a plurality of thin film piezoelectric resonators utilizing piezoelectric thin films and, in more detail, relates to a thin film piezoelectric resonator for use in a filter for a communication apparatus, a thin film piezoelectric device, and a method of manufacturing the device.

Moreover, the present invention relates to a thin film piezoelectric resonator utilizing a piezoelectric thin film for use in broad fields such as a thin film filter for use in a mobile communication apparatus or the like, a duplexer or transmission/reception switching unit, a thin film voltage control oscillator (VCO), various types of sensors and the like, a device using the resonator, and a method of manufacturing the device.

BACKGROUND ART

A device utilizing a piezoelectric phenomenon has been used in a broad field. While miniaturization and power saving of a portable apparatus advance, use of a surface acoustic wave (SAW) device as a filter for RF and IF filter has been increased. An SAW filter has met user's strictly required specifications by improvement of design and production technique, but improvement of characteristics has been nearly limited with increase of a utilized frequency, and a great technical innovation has been required both in miniaturization of electrode formation and securement of stable output.

On the other hand, in a thin film bulk acoustic resonator (hereinafter referred to as FBAR) and stacked thin film bulk acoustic resonators and filters (hereinafter referred to as SBAR) utilizing thickness vibration of a piezoelectric thin film, a thin film mainly constituted of a piezoelectric material, and electrodes for driving it are formed on a thin support film disposed on a substrate, and basic resonance in a gigahertz band is possible. When the filter is constituted of FBAR or SBAR, it is possible to achieve remarkable miniaturization, low loss/broad band operation and integration with a semiconductor integrated circuit, which are expected to be applicable to a future extremely miniature portable apparatus.

A thin film piezoelectric resonator or vibrator such as FBAR, SBAR applied to the resonator, filter or the like utilizing the elastic wave is manufactured as follows.

A substrate film or base film made of a dielectric thin film, an electric conductor thin film, or a laminate thereof is formed on a substrate of a semiconductor single crystal such as silicon, polycrystal diamond formed on a silicon wafer, insulator such as glass, or a constantly elastic metal such as elinvar by various thin film forming methods. A piezoelectric thin film is formed on this substrate film, and an upper structure is further formed if necessary. After forming each layer, or forming all layers, each film is subjected to a physical or chemical treatment to thereby perform patterning and etching. A suspended structure in which a portion positioned under a vibration portion is removed from the substrate is prepared by anisotropic etching based on a wet process, thereafter the obtained structure is separated by the unit of one device if necessary, and accordingly a thin film piezoelectric device is obtained.

For example, a thin film piezoelectric resonator described in JP(A)-58-153412 or JP(A)-60-142607 is manufactured, when a substrate film, a lower electrode, a piezoelectric thin film, and an upper electrode are formed on the upper surface of a substrate, thereafter a via hole is formed by removing a portion of the substrate under a portion constituting the vibration portion from the lower surface of the substrate. When the substrate is made of silicon, a via hole is formed by etching and removing a part of the silicon substrate from the back surface using a heated KOH aqueous solution. Accordingly, a resonator can be prepared having a configuration in which an edge portion of a structure consisted of a layer of a piezoelectric material sandwiched between metal electrodes is supported by a portion around the via hole on the front surface (upper surface) of the silicon substrate.

However, when wet etching is performed using alkali such as KOH, side planes of the via hole are inclined 54.7 degrees with respect to a (100) silicon substrate surface because the etching proceeds in parallel with (111) face, and a distance between centers of adjacent resonators has to be remarkably enlarged. For example, when a resonator having a vibration portion with a plane dimension of about 150 μm×150 μm is constituted on a silicon wafer with thickness of 300 μm, the resonator requires a back-surface etching hole of about 575 μm×575 μm and the distance between the centers of the adjacent resonators is 575 μm or more. This inhibits high density integration of an FBAR resonator. Moreover, when metal electrodes disposed in such a manner as to sandwich a piezoelectric thin film are extended to connect adjacent resonators, electric resistance increases because of longer distance of the metal electrodes. Therefore, there is a problem that insertion loss of the thin film piezoelectric device prepared by combining a plurality of FBAR resonators becomes remarkably large. An acquired amount of final products, that is, the number of thin film piezoelectric resonators formed per unit area on a wafer is limited, and a region of about ⅕ of a wafer area is only utilized for the resonator to produce devices.

A second method of the conventional technique to manufacture thin film piezoelectric resonators such as FBAR, SBAR applied to the thin film piezoelectric device is making of an air bridge type FBAR device as described, for example, in JP(A)-2-13109. Usually, a sacrificial layer is disposed at first, and next a piezoelectric resonator is produced on this sacrificial layer. The sacrificial layer is removed in or near the end of the process, and the vibration portion is formed. Since all processes are performed on the wafer front surface, this method does not require alignment of patterns on the opposite surfaces of the wafer or a large area opening in the back surface of the wafer. In JP(A)-2000-69594, a constitution and a manufacturing method of an air bridge type FBAR/SBAR device using phosphor silicate glass (PSG) as the sacrificial layer are described.

However, in this method, a long complicated step is required. That is, after a series of steps of formation of a hollow in the front surface of the wafer by etching, deposition of the sacrificial layer on the front surface of the wafer by a thermal enhanced chemical vapor deposition (CVD) method, planarization and smoothening of the wafer surface by CMP polishing, and deposition of the lower electrode, the piezoelectric thin film, and the upper electrode and formation of the pattern on the sacrificial layer, a via (hole) extending to the hollow is made, an upper structure deposited on the front surface of the wafer is protected by a resist or the like, and an liquid etching reagent is penetrated through the via hole to thereby remove a sacrificial material from the hollow. Moreover, the number of masks for use in forming the pattern largely increases. As the manufacturing step is long and complicated, the cost of the device is increased, yield of a product drops, which results in further increase of the cost of the device. It is difficult to spread this expensive device as a general-purpose component for a mobile communication apparatus. Since the liquid etching reagent for use in removing sacrificial materials such as phosphor silicate glass (PSG) corrodes the layers of the lower electrode, the piezoelectric thin film, and the upper electrode constituting the upper structure, the materials usable in the upper structure are remarkably limited, Furthermore, there is a serious problem that it is difficult to prepare an FBAR or SBAR structure having a desired dimensional precision.

As piezoelectric materials for the thin film piezoelectric device, aluminum nitride (AlN), zinc oxide (ZnO), cadmium sulfide (CdS), lead titanate (PT($PbTiO_3$)), lead zirconate titanate (PZT(Pb(Zr, Ti)$O_3$)) and the like are used. Especially, AlN has a high propagation speed of an elastic wave, and is suitable as the piezoelectric material for a thin film piezoelectric resonator and a thin film filter operating in a high-frequency band region.

Since the FBAR and SRAR obtain resonance by propagation of the elastic wave in the thin film, resonance characteristics of the FBAR and SBAR are largely influenced by not only vibration characteristics of the piezoelectric thin film but also those of the electrode layer or the substrate film. Therefore, various restrictions exist from a vibration characteristic aspect with respect to shapes and thicknesses of the electrode layer and the substrate film. For example, when the electrode layer or the substrate film is thickened, there is a problem that effective electromechanical coupling coefficient of the FBAR or SBAR is reduced. On the other hand, when the metal electrode layer is thinned and elongated, conductor loss becomes higher by the increase of electric resistance, and therefore various restrictions are generated in designing the structure of the thin film piezo electric device prepared by combining a plurality of FBARs or SBARs.

The thin film piezoelectric device exerting a sufficient performance in a gigahertz band has not been obtained for the above reason. Therefore, there has been a strong demand for realization of a high-performance thin film piezoelectric device in which all characteristics such as an electromechanical coupling coefficient, acoustic quality factor (Q value), temperature stability of a resonant frequency, and insertion loss of a vibration portion including not only the piezoelectric thin film but also the electrode layer and the substrate film are improved. Especially, the insertion loss is an important parameter which influences the performance in constituting the resonator or the filter, and largely depends on the quality and characteristics of the metal electrode thin film for use.

DISCLOSURE OF THE INVENTION

The present invention has been developed in consideration of the above-described problems, and an object of the present invention is to provide a thin film piezoelectric device which is prepared by combining a plurality of resonators constituted of an FBAR or an SBAR having a large electromechanical coupling coefficient and superior acoustic quality factor (Q value) and frequency temperature characteristic and whose insertion loss is small and whose performance has been improved.

According to the present invention, to achieve the above-described object, there are provided the following high-performance thin film piezoelectric device which is superior in the acoustic quality factor, bandwidth, temperature characteristic and the like and whose insertion loss is small, and a method of manufacturing the device.

It has been known that the insertion loss of the thin film piezoelectric device, for example, a filter prepared by combining a plurality of thin film piezoelectric resonators depends on a conductor loss of a metal electrode layer. The present inventors have considered that electric resistance of a metal electrode electrically connected to adjacent thin film piezoelectric resonators drops, when a distance between centers of the adjacent thin film piezoelectric resonators is shortened, and, as a result, the insertion loss can be largely lowered. Then, as a result of various studies of measures to shorten the distance between the centers of the adjacent thin film piezoelectric resonators, it has been found that applying of anisotropic etching by a deep graving type reactive ion etching (deep RIE) process which is deep trench etching utilizing plasma is most preferable solving means both in improvement of the performance of the thin film piezoelectric device and reduction of the cost.

In order to attain the above object, according to the present invention, there is provided a thin film piezoelectric device including a substrate having a plurality of vibration spaces and a piezoelectric laminated structure formed on the substrate, a plurality of thin film piezoelectric resonators being formed facing the vibration spaces, wherein the piezoelectric laminated structure has at least a piezoelectric film and a metal electrode formed on at least a part of each of opposite surfaces of the piezoelectric film, the piezoelectric laminated structure comprises diaphragms positioned facing the vibration spaces, and a support area other than the diaphragms, at least one set of two adjacent thin film piezoelectric resonators are electrically connected to each other through the metal electrode, the thin film piezoelectric device comprising at least one set of two adjacent thin film piezoelectric resonators in which D0 is a distance between the centers of the diaphragms of the two electrically connected adjacent thin film piezoelectric resonators and D1 is a length of a segment of a support area on a straight line passing through centers of the diaphragms of two electrically connected adjacent thin film piezoelectric resonators, and a ratio D1/D0 is 0.1 to 0.5.

In an aspect of the present invention, the ratio D1/D0 is in a range of 0.1 to 0.5 with respect to all the sets of two electrically connected adjacent thin film piezoelectric resonators. In an aspect of the present invention, each of the vibration spaces is fabricated by a via hole extending from the surface of the substrate on which the piezoelectric laminated structure is formed to the opposite surface, and a side wall surface of the via hole forms an angle in a range of 80 to 100° with respect to the surface of the substrate on which the piezoelectric laminated structure is formed.

In an aspect of the present invention, the piezoelectric laminated structure comprises a lower electrode constituting the metal electrode, the piezoelectric film, and an upper electrode constituting the metal electrode stacked in order from the substrate side in at least one thin film piezoelectric resonator. In an aspect of the present invention, the upper electrode of the at least one thin film piezoelectric resonator comprises two electrode portions.

In an aspect of the present invention, the piezoelectric laminated structure comprises a lower electrode constituting the metal electrode, a first piezoelectric film, an inner electrode constituting the metal electrode, a second piezoelectric film, and an upper electrode constituting the metal electrode stacked in order from the substrate side in at least one thin film piezoelectric resonator.

In an aspect of the present invention, at least one insulating layer of silicon oxide and/or silicon nitride as a main component is attached to the diaphragm. In an aspect of the present invention, an insulating layer comprising at least one layer of silicon oxide and/or silicon nitride as a main component intervenes only between the support area of the piezoelectric laminated structure and the substrate.

In an aspect of the present invention, the piezoelectric film is an oriented crystal film represented by a general formula $Al_{1-x}Ga_xN$ (where 0<x<1) and made of a solid solution of aluminum nitride and gallium nitride showing a c-axis orientation, and a rocking curve half value width (FWHM) of a diffraction peak of a (0002) surface of the film is 3.0° or less in at least one thin film piezoelectric resonator. In an aspect of the present invention, the piezoelectric film is a zinc oxide thin film showing a c-axis orientation, and a rocking curve half value width (FWHM) of a diffraction peak of a (0002) surface of the film is 3.0° or less in at least one thin film piezoelectric resonator. In an aspect of the present invention, the piezoelectric film is a lead titanate thin film or a lead zirconate titanate thin film in at least one thin film piezoelectric resonator.

In an aspect of the present invention, the planar shape of one of the diaphragms has two pairs of opposite sides, and at least one part of opposite sides is formed to be non-parallel in at least one thin film piezoelectric resonator. In an aspect of the present invention, at least a part of the planar shape of one of the diaphragms is formed by a non-square irregular polygonal shape in at least one thin film piezoelectric resonator. In an aspect of the present invention, the planar shape of one of the diaphragms is formed by a non-square irregular polygonal shape including a curved portion in at least a part of the shape in at least one thin film piezoelectric resonator.

In an aspect of the present invention, the thin film piezoelectric device being a thin film piezoelectric filter. In an aspect of the present invention, the thin film piezoelectric filter comprises, a ladder type circuit comprising a plurality of thin film piezoelectric resonators connected in series and at least one of the thin film piezoelectric resonators branched from/connected to the plurality of resonators connected in series.

In an aspect of the present invention, the thin film piezoelectric device being a duplexer comprising a plurality of thin film piezoelectric filters. In an aspect of the present invention, the thin film piezoelectric filter comprises a ladder type circuit comprising a plurality of thin film piezoelectric resonators connected in series and at least one of the thin film piezoelectric resonators branched from/connected to the plurality of resonators connected in series.

In order to attain the above object, according to the present invention, there is also provided a method of manufacturing the thin film piezoelectric device according to claim 1, comprising the steps of: forming the piezoelectric laminated structure on the substrate comprising a semiconductor or an insulator; and thereafter forming the vibration spaces in the substrate from a side opposite to the side on which the piezoelectric laminated structure is fabricated by a deep graving type reactive ion etching process.

In order to attain the above object, according to the present invention, there is also provided a thin film piezoelectric resonator formed using a substrate having a vibration space, and a piezoelectric laminated structure formed on the substrate, wherein the piezoelectric laminated structure comprises at least a piezoelectric film and a metal electrode formed on at least a part of each of the fabricated by a via hole extending from the surface of the substrate on which the piezoelectric laminated structure is formed to an opposite surface, and a side wall surface of the via hole forms an angle in a range of 80 to 100° with respect to the surface of the substrate on which the piezoelectric laminated structure is formed.

In the present invention, to form the vibration portion having a structure in which the layer of the piezoelectric material is held between the plurality of metal electrodes on the upper surface of the substrate constituted of the semiconductor or the insulator, the substrate portion present under the portion constituting the vibration portion is anisotropically removed from the underside of the substrate by the deep graving type reactive ion etching (deep RIE) process which is deep trench etching utilizing plasma, and the via hole constituting the vibration space is formed. It is to be noted that in the present description, the main surface which is one of two main surfaces of the substrate and on which the piezoelectric laminated structure including the vibration portion is formed is referred to as the "upper surface" for the sake of convenience, and the other main surface is sometimes referred to as the "lower surface" for the sake of convenienece.

The deep RIE process is plasma etching using a reactive gas, and is suitable for anisotropically working the silicon wafer at a high etching speed to form a deep trench or via hole having a substantially vertical sectional shape at a tapered angle close to verticality. One example will be described. The silicon wafer in which the predetermined portion is masked with a pattern formed by photo resist is charged in the reaction vessel of the dry etching equipment comprising an inductively coupled plasma generation power supply. The silicon wafer is clamped on a high-frequency (13.56 MHz) electrode by an electrostatic chuck, and held in the vicinity of room temperature (−20 to 60° C.) by cooling with a helium gas. While a plasma state is held to be constant, the etching of silicon and the formation of the protective film on the side wall can be alternately, and periodically performed by adoption of a time modulation process in which an $SF_6$ gas that is an etching gas and a $C_4F_8$ gas for forming the protective film are alternately introduced into the vessel by a gas switch control unit. At the $C_4F_8$ discharge time in the first step, the protective film is formed on the side wall by deposition of an $nCF_2$ polymer based film by ionization and dissociation of the $C_4F_8$ gas.

In the second step, the high-frequency bias potential is applied, and the protective film on the bottom surface of a working pattern is efficiently removed. The etching in a vertical direction proceeds by collision of fluorine radicals generated by the $SF_6$ discharge of the third step. When the time constant of each step is optimized, deposition of necessary minimum amount of protective film and high-anisotropy etching by the $SF_6$ plasma can be realized. The etching speed, etching worked shapes selection ratio of silicon to the mask material, uniformity of the etching and the like are influenced by the time constant of each step. This method has a characteristic that any special equipment for controlling the sample temperature is not required, and the working at the high etching speed and with high anisotropy can be performed in the vicinity of room temperature.

That is, the side wall of the via hole is formed at the tapered angle close to the verticality toward the upper surface from the lower surface of the substrate by the application of the deep RIE process. Therefore, a via hole having a small difference between the dimension of the diaphragm which corresponds to a portion of the lower electrode or the insulating layer facing via hole which is a vibration space and that of the opening in the lower surface of the substrate is formed, and the distance between the centers of the electrically connected adjacent thin film piezoelectric resonators can be shortened. Here, the tapered angle is an angle formed by the average plane representing the side wall surface of the via hole formed toward the upper surface from the lower surface of the substrate with the lower surface of the substrate or the upper surface of the substrate. When the tapered angle or club-shaped angle is in a range of 80 to 100 degrees, it can be said that the angle is close to verticality. A plurality of thin film piezoelectric resonators are constituted and formed into a device in such a manner that, on a straight line connected to the centers (two-dimensional geometric gravity centers) in the surfaces parallel to the upper surfaces of the substrate of the electrically connected adjacent thin film piezoelectric resonators, the ratio D1/D0 of the length D1 of the segment passing through the support area of the piezoelectric laminated structure existing between the diaphragms of the adjacent thin film piezoelectric resonators to the distance D0 between the centers of the electrically connected adjacent thin film piezoelectric resonators is 0.1 to 0.5. The arrangement in which the above-described ratio D1/D0 is 0.1 to 0.5 is preferable in all combinations of the electrically connected adjacent thin film piezoelectric resonators, and this arrangement may be applied to at least one set of adjacent thin film piezoelectric resonators. When the plurality of thin film piezoelectric resonators integrated in this manner are combined, a thin film piezoelectric device can be manufactured having a small insertion loss and excellent characteristic and high performance.

The center (two-dimensional geometric gravity center) in the surface parallel to the upper surface of the substrate of the thin film piezoelectric resonator in the present invention is the two-dimensional center of the diaphragm constituting the thin film piezoelectric resonator, and means the two-dimensional geometric gravity center of the diaphragm. The two-dimensional geometric gravity center of the shape surrounded with arbitrary closed curve can be obtained, when the balance is actually measured in two cases of different gravity directions, and may be graphically obtained. For example, as to the quadrangle, as described in "Introduction to Geometry" by Coxeter, "when eight points each dividing each side of the quadrangle into three equal parts are taken, and new quadrangle surrounded by four straight lines each passing through two points each dividing the side of the original quadrangle into three equal parts, and existing adjacent to each vertex of the original quadrangle, is made, this new quadrangle is a parallelogram". At this time, the intersection of the diagonal lines of the parallelogram is a geometric gravity center. In the case of an n-gon shape (n is an integer of 4 or more), the diagonal line is drawn using one vertex of the n-gon shape as a starting point, and the shape is divided into n-2 triangles. When the weighted average of the gravity center of each of the divided triangles is obtained, the gravity center of the whole n-gon shape is obtained.

The piezoelectric laminated structure constituting the thin film piezoelectric resonator in the present invention is formed of two areas defined by the positional relation with respect to the substrate having a vibration space. One area is the diaphragm positioned above the vibration space, and the other area is the support area positioned on the substrate portion (support portion), excluding the vibration space.

In the present invention, the straight line (present in the surface parallel to the upper surface of the substrate) connecting the two-dimensional centers of the electrically connected adjacent thin film piezoelectric resonators to each other, that is, the two-dimensional centers of the diaphragms of the electrically connected adjacent thin film piezoelectric resonators passes through the respective diaphragms of the adjacent thin film piezoelectric resonators and the support area existing between two diaphragms. Assuming that the lengths of the segments of the straight line passing through the diaphragms of the adjacent thin film piezoelectric resonators are D2, D3, and the length of the segment passing through the support area is D1, the distance D0 between the centers of the adjacent thin film piezoelectric resonators is represented by:

$$D0=D1+D2+D3.$$

In the present invention, each thin film piezoelectric resonator is disposed in a position wherein the straight line connecting the two-dimensional centers (centers of the diaphragms) of the electrically connected adjacent thin film piezoelectric resonators to each other has the length D1 of the segment passing through the support area existing between the adjacent thin film piezoelectric resonators and the distance D0 between the centers of the adjacent thin film piezoelectric resonators, and the ratio D1/D0 is 0.1 to 0.5, preferably 0.18 to 0.3. When the ratio D1/D0 is smaller than 0.1, the substrate portion (i.e., the side wall portion) between two via holes constituting the adjacent thin film piezoelectric resonators becomes thin, the strength remarkably drops, add the handling becomes difficult. For example, the portion unfavorably breaks during working such as dicing or during device assembly. The side wall portion between the adjacent via holes performs a function of supporting the piezoelectric laminated structure including the piezoelectric film formed on the upper surface of the substrate. When the ratio D1/D0 exceeds 0.5, the distance between the centers of the electrically connected adjacent thin film piezoelectric resonators excessively broadens, the dimension (length) of the metal electrode connecting both the resonators to each other increases, and the electric resistance of the metal electrode excessively increases. When the electric resistance of the metal electrode increases, the insertion loss of the assembled thin film piezoelectric device increases, and the device cannot be practically used as a high-frequency circuit component such as a filter for a communication apparatus.

In the present invention, D1 is, for example, 25 to 70 µm, preferably 30 to 60 µm, and D0 is, for example, 100 to 300 µm, preferably 150 to 250 µm. When these dimensions are excessively small, the substrate portion (i.e., the side wall portion) between two via holes constituting the adjacent thin film piezoelectric resonators becomes thin, the strength remarkably drops, and the handling becomes difficult. On the other hand, when the dimensions are excessively large, the distance between the centers of the electrically connected adjacent thin film piezoelectric resonators excessively broadens, the dimension (length) of the metal electrode connecting both the resonators to each other increases, and the electric resistance of the metal electrode excessively increases.

Moreover, according to the present invention, in the thin film piezoelectric resonator constituted in the position where the ratio D1/D0 of the length D1 of the segment passing through the support area in which the straight line exists between the diaphragms of the electrically connected adjacent thin film piezoelectric resonators to the distance D0 between the centers of the adjacent thin film piezoelectric resonators is 0.1 to 0.5, the planar shape of the diaphragm constituting the vibration portion of the thin film piezoelectric resonator is devised and optimized. Accordingly, the thin film piezoelectric device can be manufactured in which any extra spurious signal or noise does not enter a pass band and which has a low insertion loss and high characteristic and performance. Concrete examples of the preferable planar shape of the diaphragm include: a shape (quadrangle) having two pairs of opposite sides in such a manner that at least one pair of opposite sides are formed to be non-parallel; a polygonal shape including a non-square irregular polygonal shape in at least a part of the shape; a non-square irregular polygonal shape including a curved portion in at least a part of the shape and the like. When the symmetry of the planar shape of the diaphragm is lowered, any extra spurious signal or noise cannot enter the desired pass band, and the performance of the thin film piezoelectric device for use as the high-frequency circuit component is enhanced.

The thin film piezoelectric device of the present invention has a substrate having a plurality of vibration spaces, and a piezoelectric laminated structure formed on the substrate, and a plurality of thin film piezoelectric resonators are formed using the substrate. In one embodiment of the thin film piezoelectric resonator, a lower electrode, a piezoelectric film, and an upper electrode are formed on the substrate having a plurality of vibration spaces. The upper electrode may comprise two electrode portions.

Moreover, in another embodiment of the thin film piezoelectric resonator constituting the thin film piezoelectric device of the present invention, the piezoelectric laminated structure comprises a lower electrode, a piezoelectric film, an inner electrode, a piezoelectric film, and an upper electrode stacked in order from the substrate side.

In the present invention, as the piezoelectric material for the thin film piezoelectric device, aluminum nitride (AlN), aluminum nitride-gallium nitride based solid solution ($Al_{1-x}Ga_xN$), zinc oxide (ZnO), lead titanate ($PbTiO_3$), lead zirconate titanate ($PZT(Pb(Zr, Ti)O_3)$) and the like are usable. Especially, AlN has a high propagation speed of an elastic wave, and is suitable as the piezoelectric material for a thin film piezoelectric resonator and a thin film filter operating in a high-frequency band region.

To utilize the above-described features of the piezoelectric thin film, and improve the temperature stability of resonant frequency, it is effective to form a silicon oxide ($SiO_2$) layer as an insulating layer in the vibration portion. The vibration portion means a region in which at least two electrodes holding the piezoelectric film therebetween are superimposed in the diaphragm. $SiO_2$ has a positive temperature coefficient, and is capable of compensating for the temperature change of the resonant frequency of the piezoelectric material having a negative temperature coefficient. The insulating layer may be an $SiO_2$ single layer, or a composite layer containing $SiO_2$ and silicon nitride ($Si_3N_4$ or $SiN_x$) as a main component, As the insulating layer, an $Si_3N_4$ single layer or an $SiN_x$ single layer is usable. Furthermore, it is possible to use AlN for use as the material of the piezoelectric layer and as the material of the insulating layer.

Here, to realize the superior resonance characteristics of the thin film piezoelectric resonator, the thickness of the insulating layer is preferably set to a special range. For example, assuming that the thickness of the piezoelectric thin film containing AlN as the main component is t, and the thickness of the whole insulating layer containing silicon oxide as the main component is t', the effect is especially remarkable in a range satisfying $0.1 \leq t'/t \leq 0.5$, and the electromechanical coupling coefficient, the acoustic quality factor, and the temperature stability of the resonant frequency are all remarkably satisfactory. When $t'/t<0.1$, the electromechanical coupling coefficient and the acoustic quality factor tends to be enhanced, but the effect of improving the temperature characteristic of the resonant frequency is reduced. When $t'/t>0.5$, the electromechanical coupling coefficient and the acoustic quality factor are impaired by the presence of the insulating layer. When the insulating layer is an $SiO_2$ layer, the piezoelectric thin film made of a material other than AlN is preferably used because the absolute value of the temperature coefficient of the resonant frequency is reduced, and the characteristic of the FBAR is satisfactory.

In the thin film piezoelectric resonator constituting the thin film piezoelectric device of the present invention, for a purpose of improving the temperature characteristic of the resonant frequency, as described above, the insulating layer containing $SiO_2$ and/or silicon nitride ($Si_3N_4$ or $SiN_x$) as the main component can be formed in the vibration portion. On the other hand, when the piezoelectric material having the satisfactory temperature stability of the resonant frequency is used, it is possible to eliminate all the insulating layers. That is, a constitution may be adopted in which the insulating layer containing $SiO_2$ as the main component exists only between the support area of the piezoelectric laminated structure and the support portion of the substrate, and the insulating layer does not exist in the diaphragm portion which is the vibration portion.

The piezoelectric thin film made of aluminum nitride-gallium nitride based solid solution ($Al_{1-x}Ga_xN$) or zinc oxide (ZnO) for use as the piezoelectric materials for the thin film piezoelectric device indicates c-axis orientation, and a rocking curve half value width (FWHM) of a diffraction peak of a (0002) surface measured by an X-ray diffraction method is preferably 3.0° or less. When the rocking curve half value width (FWHM) exceeds 3.0°, an electromechanical coupling coefficient $K_t^2$ drops, the pass bandwidth necessary for forming the device cannot be sufficiently taken, and the resonance characteristic is sometimes deteriorated.

As to lead titanate ($PT(PbTiO_3)$) and lead zirconate titanate ($PZT(Pb(Zr, Ti)O_3)$, there is little dependence of the device characteristic on the rocking curve half value width (FWHM) indicating orientation of crystal.

As described above, when the distance between the centers of the electrically connected adjacent thin film piezoelectric resonators is shortened, the planar shape of the diaphragm is preferably optimized, and a plurality of thin film piezoelectric resonators having satisfactory resonance characteristic are combined and integrated, the insertion loss caused by the conductor loss of the metal electrode can be remarkably reduced. The high-performance thin film piezoelectric device can be realized in which the electromechanical coupling coefficient (e.g., the electromechanical coupling coefficient $K_t^2$ obtained from the measured values of the resonant frequency and antiresonant frequency in a range of 2.0 to 3.0 GHz is more than 4.0%) and the acoustic quality factor (Q value) are large and whose insertion loss is small and which is superior in gain and band characteristic. The high-performance thin film piezoelectric device is usable as various devices for a mobile communication apparatus. In the thin film-piezoelectric resonator of the present invention, since the vibration space is formed at the tapered angle or club-shaped angle close to verticality toward the upper surface from the lower surface of the substrate by the deep graving type reactive ion etching (deep RIE) process, the thin film piezoelectric resonators can be disposed in the vicinity of each other, and the above-described high-performance device can be provided.

BEST MODE FOR CARRYING OUT THE INVENTION

Embodiments of a thin film piezoelectric resonator, a thin film piezoelectric device, and a method of manufacturing the device will be described hereinafter in detail with reference to the drawings.

First, a thin film piezoelectric device for reference will be described before description of the embodiments of the present invention.

Figure 8A:
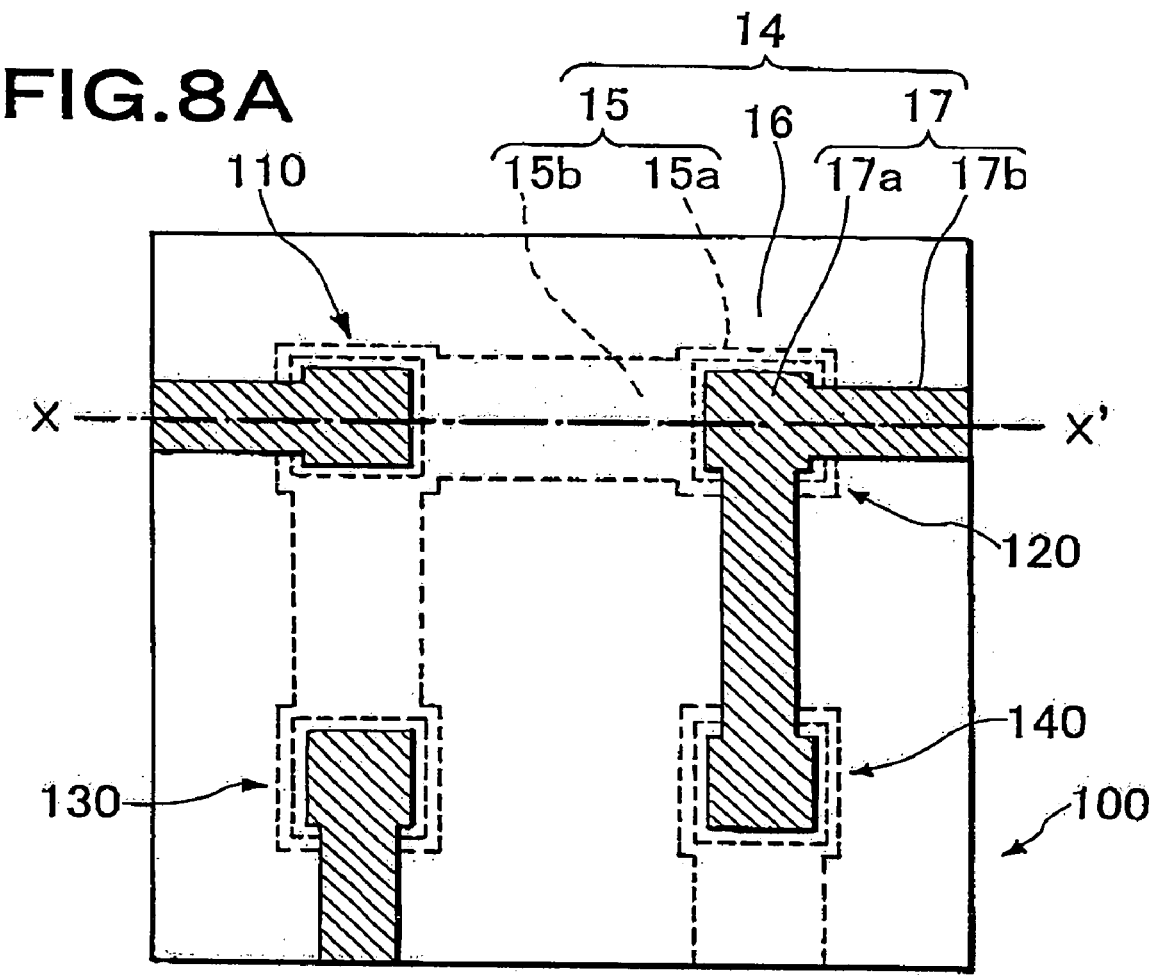
FIG. 8A is a schematic plan view showing one reference example of the thin film piezoelectric device.
Figure 8B:
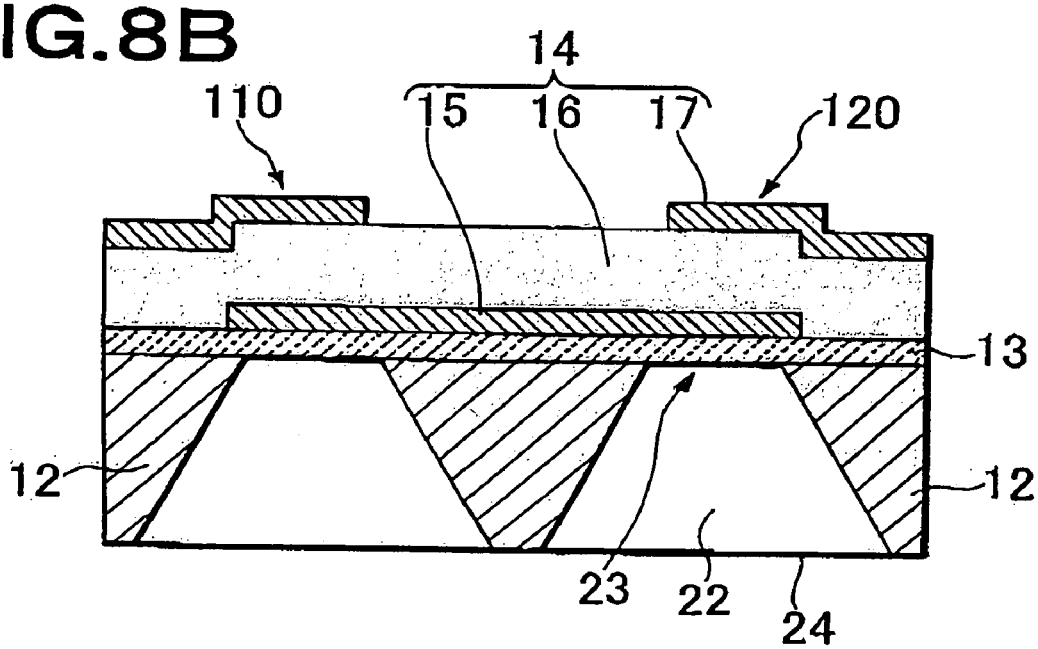
FIG. 8B is a schematic sectional view along an X-X' line of FIG. 8A.

FIG. 8A is a schematic plan view showing one reference example of the thin film piezoelectric device, and FIG. 8B is an X-X' schematic sectional view. In these figures, a thin film piezoelectric device 100 is prepared by combining an FBAR 110, an FBAR 120, an FBAR 130, and an FBAR 140. The FBAR 120 has a substrate 12, an insulating layer 13 formed on the upper surface of the substrate 12, and a piezoelectric laminated structure 14 prepared on the upper surface of the insulating layer 13. The piezoelectric laminated structure 14 comprises a lower electrode 15 formed on the upper surface of the insulating layer 13, a piezoelectric film 16 formed on the upper surface of the insulating layer 13 which is a substrate film in such a manner as to coat the lower electrode 15, and an upper electrode 17 formed on the upper surface of the piezoelectric film 16. The substrate 12 is provided with via holes 22 forming gaps. A part of the insulating layer 13 is exposed toward the via hole 22. An exposed portion of the insulating layer 13 and a portion of the piezoelectric laminated structure 14 existing in a corresponding position constitute a diaphragm 23 forming a vibration portion. The lower electrode 15 and the upper electrode 17 have main body portions 15a, 17a formed in an area corresponding to the diaphragm 23, and terminal portions 15b, 17b for connection of the main body portions 15a, 17a to the other FBAR or an external circuit. The terminal portions 15b, 17b extend to the outside of the area corresponding to the diaphragm 23. The FBAR 110, FBAR 130, and FBAR 140 are also similarly constituted.

In this reference example, for example, when the substrate 12 is made of silicon, a part of the silicon substrate is etched and removed from the lower surface using a heated KOH aqueous solution to thereby form the via holes 22. However, when wet etching is performed using alkali such as KOH, the etching proceeds at a tilt of 54.7 degrees with respect to a (100) silicon substrate surface because the etching proceeds in parallel with a (111) surface, and a distance between the diaphragms of the adjacent resonators becomes remarkably large, For example, the diaphragm 23 having a planar dimension of 150 µm×150 µm, constituted on the upper surface of a silicon wafer with a thickness of 300 µm, requires a lower surface side etching opening 24 of about 575 µm×575 µm, and a distance between the diaphragm centers of the adjacent resonators is 575 µm or more. That is, a dimension of the support area of the piezoelectric laminated structure existing between electrically connected adjacent thin film piezoelectric resonators is a long distance of about 0.74 times or more the distance between the centers of the diaphragms of the adjacent thin film piezoelectric resonators.

Therefore, high-density integration of the FBAR resonator is hindered. Moreover, when the adjacent resonators are electrically connected to each other by metal electrodes (lower electrode 15 and upper electrode 17) holding the piezoelectric film 16 therebetween, electric resistance of the metal electrode increases. Therefore, there is caused a problem that insertion loss of the thin film piezoelectric device 100 prepared by combining the FBAR resonators 110, 120, 130, and 140 is remarkably large.

Figure 1A:
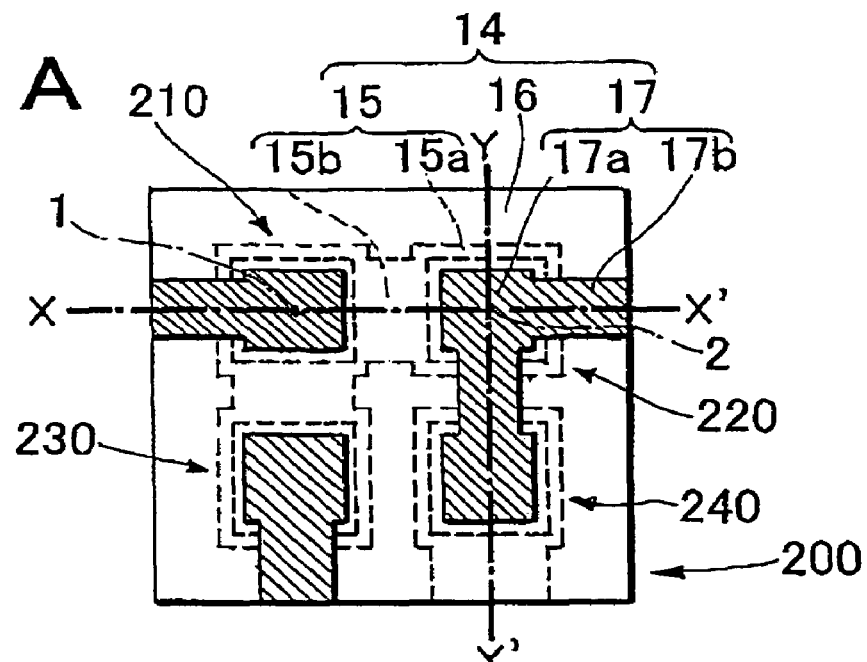
FIG. 1A is a schematic plan view showing one embodiment of a thin film piezoelectric device according to the present invention.
Figure 1B:
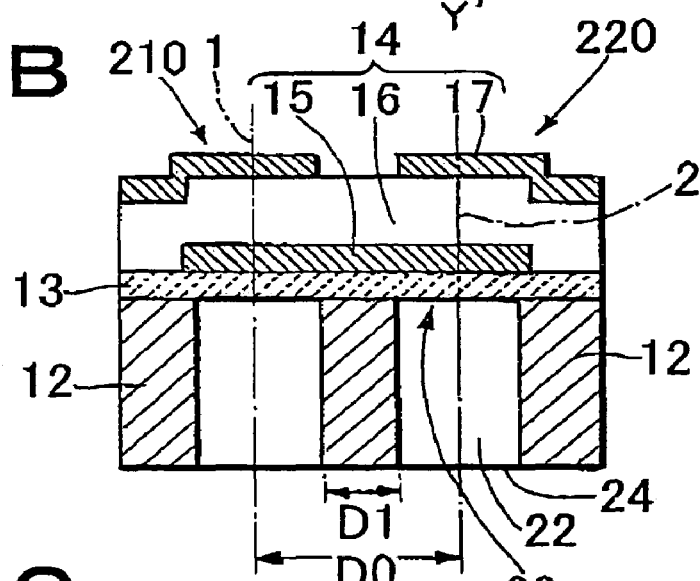
FIG. 1B is a schematic sectional view along an X-X' line of FIG. 1A.
Figure 1C:
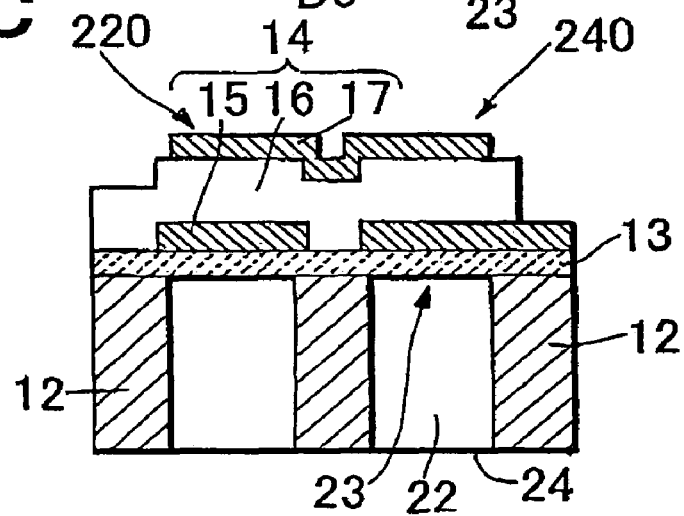
FIG. 1C is a schematic sectional view along a Y-Y' line of FIG. 1A.

On the other hand, one embodiment of a thin film piezoelectric device according to the present invention has a constitution shown in FIGS. 1A to 1C. FIG. 1A is a schematic plan view showing the thin film piezoelectric device of the present embodiment, FIG. 1B is an X-X' schematic sectional view, and FIG. 1C is a Y-Y' schematic sectional view. In these figures, a thin film piezoelectric device 200 is prepared by combining an FBAR 210, an FBAR 220, an FBAR 230, and an FBAR 240. The FBAR 220 has a substrate 12, an insulating layer 13 formed on the upper surface of the substrate 12, and a piezoelectric laminated structure 14 prepared on the upper surface of the insulating layer 13. The piezoelectric laminated structure 14 comprises a lower electrode 15 formed on the upper surface of the insulating layer 13, a piezoelectric film 16 formed on the upper surface of the insulating layer 13 in such a manner as to coat the lower electrode 15, and an upper electrode 17 formed on the upper surface of the piezoelectric film 16. The substrate 12 is provided with via holes 22 forming gaps. A part of the insulating layer 13 is exposed toward the via hole 22. An exposed portion of the insulating layer 13 and a portion of the piezoelectric laminated structure 14 existing in a corresponding position constitute a diaphragm 23 including a vibration portion. The lower electrode 15 and the upper electrode 17 have main body portions 15a, 17a formed in an area corresponding to the diaphragm 23, and terminal portions 15b, 17b for connection of the main body portions 15a, 17a to the other FBAR or an external circuit. The terminal portions 15b, 17b extend to the outside of the area corresponding to the diaphragm 23. The FBAR 210, FBAR 230, and FBAR 240 are also similarly constituted.

In the present embodiment, by application of a deep RIE process, the side wall surface of the via hole 22 is formed from one surface (e.g., the lower surface) of the substrate 12 to the opposite surface (e.g., the upper surface) at a tapered angle or club-shaped angle close to verticality. Thus, the via hole 22 is formed with a small difference between the dimension of the diaphragm 23 which corresponds to a portion of the lower electrode 15 or the insulating layer 13 facing the via hole 22 constituting a vibration space and that of an etching opening 24 of a lower surface of the substrate, and therefore adjacent thin film piezoelectric resonators can be brought close to each other and disposed. Therefore, in a straight line (X-X' line in FIG. 1A) passing through centers (two-dimensional geometric gravity centers) 1 and 2 in a plane parallel to the substrate surfaces of the diaphragms 23 of the electrically connected adjacent thin film piezoelectric resonators 210 and 220, a ratio D1/D0 can be reduced where D1 is a length of a segment passing through the support area of the piezoelectric laminated structure on the straight line existing between the adjacent thin film piezoelectric resonators and D0 is a distance between the diaphragm centers of the adjacent thin film piezoelectric resonators (see FIGS. 1A and 1B). The thin film piezoelectric resonators 210, 220 are electrically connected to each other via the lower electrode 15. The electrically connected adjacent thin film piezoelectric resonators 210 and 230 also have a similar relation. The electrically connected adjacent thin film piezoelectric resonators 220 and 240 also have a similar relation, and in this case, the electric connection is performed via the upper electrode 17.

The thin film piezoelectric device of the present embodiment is a thin film piezoelectric filter constituted by a ladder type circuit in which the thin film piezoelectric resonator 210 is connected in series to the thin film piezoelectric resonator 220, and the thin film piezoelectric resonators 230 and 240 are branched/connected to the resonators 210, 220, respectively.

Figure 2A:
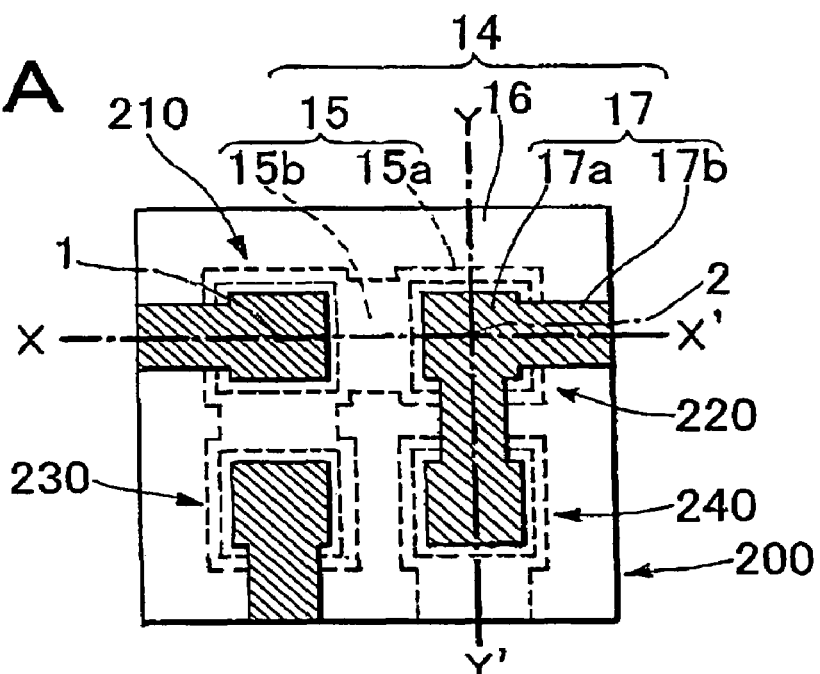
FIG. 2A is a schematic plan view showing another embodiment of the thin film piezoelectric device according to the present invention.
Figure 2B:
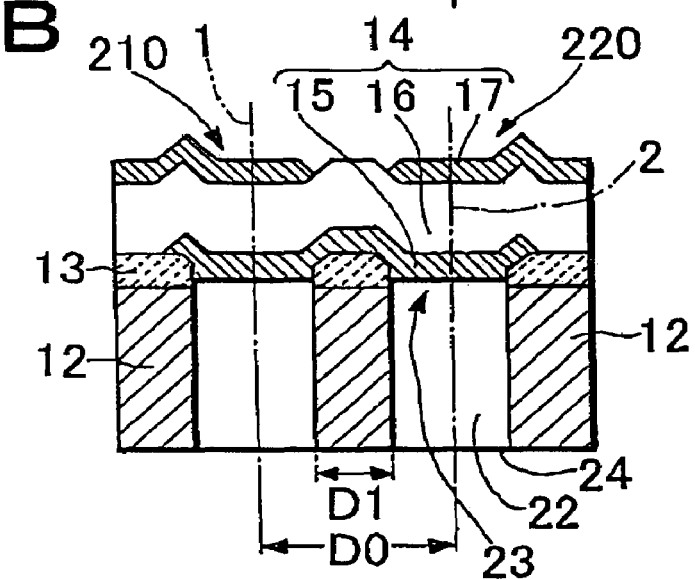
FIG. 2B is a schematic sectional view along an X-X' line of FIG. 2A.
Figure 2C:
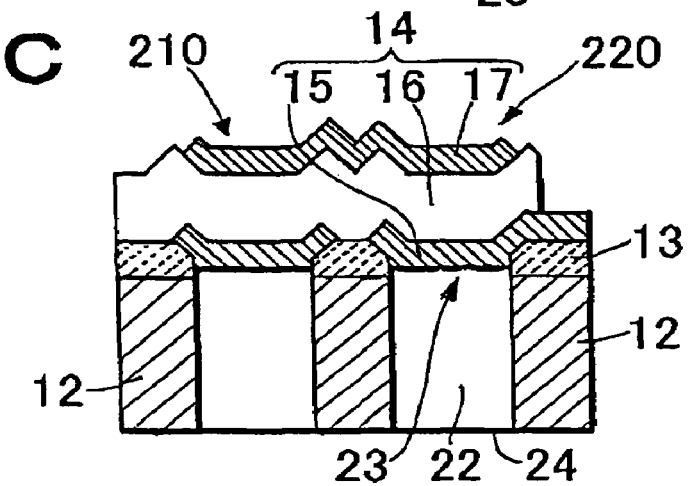
FIG. 2C is a schemtic sectional view along a Y-Y' line of FIG. 2A.

FIGS. 2A to 2C show another embodiment of the thin film piezoelectric device according to the present invention. FIG. 2A is a schematic plan view showing the thin film piezoelectric device of the present embodiment, FIG. 2B is an X-X' schematic sectional view, and FIG. 2C is a Y-Y' schematic sectional view. In these figures, members having functions similar to those in FIGS. 1A to 1C described above are denoted with the same reference numerals.

A thin film piezoelectric device 200 is prepared by combining an FBAR 210, an FBAR 220, an FBAR 230, and an FBAR 240. The FBAR 220 has a substrate 12 provided with via holes 22 forming gaps, and a piezoelectric laminated structure 14 prepared on the upper surface of the insulating layer 13 in such a manner as to be bridged across the via hole 22. In the present embodiment, the insulating layer 13 exists in portions (support portions for the piezoelectric laminated structure 14) other than the via holes 22 in the upper surface of the substrate 12, and the insulating layer 13 intervenes between the support area of the piezoelectric laminated structure 14 and the support portion of the substrate.

Since the insulating layer 13 does not exist in the portion of the diaphragm 23 facing the via hole 22, an electromechanical coupling coefficient increases, and a bandwidth broadens. The piezoelectric laminated structure 14 comprises a lower electrode 15 a part of which contacts the upper surface of the insulating layer 13, a piezoelectric film 16 formed on the upper surface of the insulating layer 13 in such a manner as to coat the lower electrode 15, and an upper electrode 17 formed on the upper surface of the piezoelectric film 16. A part of the lower electrode 15 is exposed toward the via hole 22 without disposing the insulating layer 13. An exposed portion of the lower electrode 15 and a portion of the piezoelectric laminated structure 14 existing in a corresponding position constitute a diaphragm 23 including a vibration portion. The lower electrode 15 and the upper electrode 17 have main body portions 15a, 17a formed in an area corresponding to the diaphragm 23, and terminal portions 15b, 17b for connection of the main body portions 15a, 17a to the other FBAR or an external circuit. The terminal portions 15b, 17b extend to the outside of the area corresponding to the diaphragm 23. The FBAR 210, FBAR 230, and FBAR 240 are also similarly constituted.

Also in the present embodiment, in the same manner as in the embodiment of FIGS. 1A to 1C, the adjacent thin film piezoelectric resonators can be brought close to each other and disposed. Therefore, in a straight line (X-X' line in FIG. 2A) passing through centers (two-dimensional geometric gravity centers) 1 and 2 of the diaphragms 23 of the electrically connected adjacent thin film piezoelectric resonators 210 and 220, a ratio D1/D0 can be reduced, where D1 is a length of a segment passing through the support area of the piezoelectric laminated structure on the straight line existing between the diaphragms 23 of the adjacent thin film piezoelectric resonators and D0 is a distance between the diaphragm centers of the adjacent thin film piezoelectric resonators (see FIGS. 2A and 2B). The thin film piezoelectric resonators 210, 220 are electrically connected to each other via the lower electrode 15. The electrically connected adjacent thin film piezoelectric resonators 210 and 230 also have a similar relation. The electrically connected adjacent thin film piezoelectric resonators 220, and 240 also have a similar relation, and in this case, the electric connection is performed via the upper electrode 17.

The thin film piezoelectric device of the present embodiment is a thin film piezoelectric filter constituted by a ladder type circuit in which the thin film piezoelectric resonator 210 is connected in series to the thin film piezoelectric resonator 220, and the thin film piezoelectric resonators 230 and 240 are branched/connected to the resonators 210, 220, respectively.

Figure 3A:
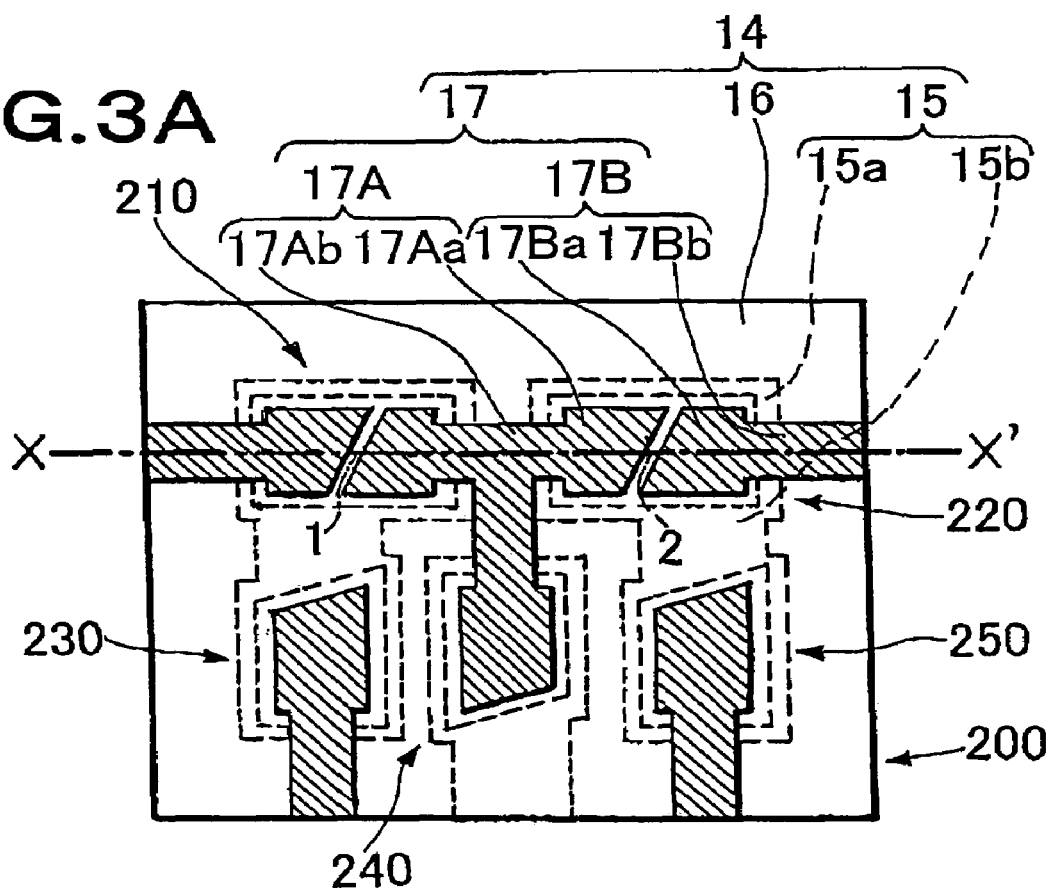
FIG. 3A is a schematic plan view showing still another embodiment of the thin film piezoelectric device according to the present invention.
Figure 3B:
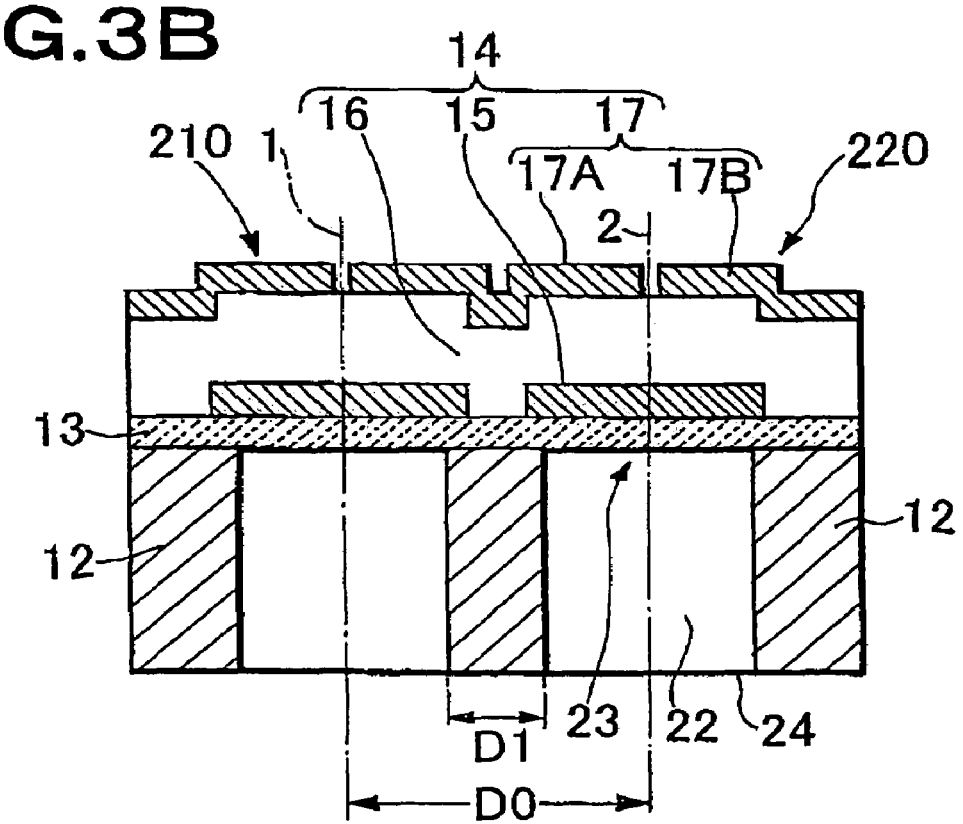
FIG. 3B is a schematic sectional view along an X-X' line of FIG. 3A.

FIGS. 3A and 3B show still another embodiment of the thin film piezoelectric device according to the present invention. FIG. 3A is a schematic plan view showing the thin film piezoelectric device of the present embodiment, and FIG. 3B is an X-X' schematic sectional view. Also in these figures, members having functions similar to those in FIGS. 1A to 2C described above are denoted with the same reference numerals.

A thin film piezoelectric device 200 is prepared by combining an FBAR 210, an FBAR 220, an FBAR 230, an FBAR 240, and an FBAR 250. The FBAR 220 has a substrate 12, an insulating layer 13 formed on the upper surface of the substrate 12, and a piezoelectric laminated structure 14 prepared on the upper surface of the insulating layer 13. The piezoelectric laminated structure 14 comprises a lower electrode 15 formed on the upper surface of the insulating layer 13, a piezoelectric film 16 formed on the upper surface of the insulating layer 13 in such a manner as to coat the lower electrode 15, and an upper electrode 17 formed on the upper surface of the piezoelectric film 16. The substrate 12 is provided with via holes 22 forming gaps. A part of the insulating layer 13 is exposed toward the via hole 22. An exposed portion of the insulating layer 13 and a portion of the piezoelectric laminated structure 14 existing in a corresponding position constitute a diaphragm 23 including a vibration portion. The lower electrode 15 has a main body portion 15a formed in an area corresponding to the diaphragm 23, and a terminal portion 15b for connection to the other FBAR or an external circuit. The terminal portion 15b extends to the outside of the area corresponding to the diaphragm 23. In the present embodiment, the upper electrode 17 has a first electrode portion 17A and a second electrode portion 17B. These electrode portions 17A, 17B have main body portions 17Aa, 17Ba, and terminal portions 17Ab, 17Bb. The main body portions 17Aa, 17Ba are positioned in the area corresponding to the diaphragm 23, and the terminal portions 17Ab, 17Bb for the connection of the main body portions 17Aa, 17Ba to the other FBAR or the external circuit extend to the outside of the area corresponding to the diaphragm 23.

The FBAR 220 comprising the upper electrode including two electrode portions shown in the embodiment of FIGS. 3A and 3B is referred to as a multiplex mode resonator. An input voltage is applied between one electrode portion (e.g., the second electrode portion 17B) of the upper electrode 17 and the lower electrode 15, and the voltage between the other electrode portion (e.g., the first electrode portion 17A) of the upper electrode 17 and the lower electrode 15 can propagate as an output voltage to the adjacent FBAR 210. Therefore, the FBAR 220 itself develops the function of a filter. When the filter having this constitution is used as a constituting element of a band pass filter, a wire-bonding in an element can be omitted, therefore there is not any loss caused by the wire-bonding, attenuation characteristic of a blocking band becomes satisfactory, and frequency response is enhanced. This also applies to the FBAR 210.

Also in the present embodiment, in the same manner as in the embodiment of FIGS. 1A to 1C, the adjacent thin film piezoelectric resonators can be brought close to each other and disposed. Therefore, in a straight line (X-X' line in FIG. 3A) passing through centers (two-dimensional geometric gravity centers) 1 and 2 of the diaphragms 23 of the electrically connected adjacent thin film piezoelectric resonators 210 and 220, a ratio D1/D0 can be reduced, where D1 is a length of a segment passing through the support area of the piezoelectric laminated structure on the straight line existing between the diaphragms 23 of the adjacent thin film piezoelectric resonators and D0 is a distance between the diaphragm centers of the adjacent thin film piezoelectric resonators (see FIGS. 3A and 3B). This also applies to a relation between the electrically connected adjacent thin film piezoelectric resonators 210 and 240, and that between the electrically connected adjacent thin film piezoelectric resonators 220 and 240. This also applies to a relation between the electrically connected adjacent thin film piezoelectric resonators 210 and 230, and that between the electrically connected adjacent thin film piezoelectric resonators 220 and 250. In these cases, the electric connection is performed via the lower electrode 15.

The thin film piezoelectric device of the present embodiment is a thin film piezoelectric filter constituted by a ladder type circuit in which the thin film piezoelectric resonators 210, 220 are connected in series to each other, and these resonators are branched/connected to the thin film piezoelectric resonators 230, 240, and 250.

As the substrate 12 of the thin film piezoelectric device of the present invention, a semiconductor single crystal such as a silicon (100) single crystal, or a polycrystal film such as diamond formed on the substrate surface of a silicon wafer or the like is usable. As the substrate 12, another semiconductor or insulating substrate may be used.

In the present invention, a substrate portion disposed under the portion constituting the diaphragm constituting the vibration portion is anisotropically removed by a deep graving type reactive ion etching (deep RIE) process which is deep trench etching utilizing plasma to fabricate the via hole 22 in the substrate 12. For example, when the substrate is made of silicon, an $SF_6$ gas and a $C_4F_8$ gas are alternately introduced into an etching equipment to repeat the etching and the formation of a side wall protective film. Accordingly, an etching speed ratio of the side wall surface to the bottom surface is controlled, and a deep via hole having a prismatic or columnar side wall surface is vertically formed at the etching speed of several micrometers per minute. Therefore, planar shape and dimension of the diaphragm 23 are substantially equal to those of an opening 24 in the lower surface of the substrate, and the diaphragms 23 of the adjacent resonators can be remarkably brought close to each other. For example, when the diaphragm 23 having a transverse dimension of about 150 μm×150 μm is formed while foaming the undersurface-side etching opening 24 having the equal dimension, the distance between the diaphragm centers of the adjacent resonators can be set to a value around 180 μm.

Accordingly, the FBAR resonators can be integrated with high density, and the insertion loss of the thin film piezoelectric device 200 prepared by combining the FBAR resonators 210, 220, 230, 240, further 250 can be remarkably reduced, because the electric resistance of the metal electrode is reduced in electrically connecting the adjacent resonators to each other using the metal electrodes (lower electrode 15 and upper electrode 17) holding the piezoelectric film 16 therebetween. It is to be noted that the gap formed in the substrate 12 is not limited to the gap by the via hole 22, and may have another configuration as long as the vibration of the diaphragm 23 constituting the vibration portion is allowed.

As the insulating layer 13, a dielectric film containing silicon oxide ($SiO_2$) or silicon nitride ($Si_3N_4$ or $SiN_x$) as a main component is usable. As to the material of this insulating layer 13, the main component indicates a component whose content in the dielectric film is 50% or more by equivalent ratio. The dielectric film may comprise a single layer, or a plurality of layers in which layers (adhesive layers) for enhancing adhesion is included. Examples of the dielectric film comprising a plurality of layers include lamination of the above-described silicon oxide ($SiO_2$) layer and the silicon nitride ($Si_3N_4$ or $SiN_x$) layer. The insulating layer 13 has a thickness of, for example, 0.2 to 1.0 μm. Examples of a method of forming the insulating layer 13 include a method of thermally oxidizing the surface of the substrate 12 made of silicon, and a chemical vapor deposition (CVD) method. Furthermore, the dielectric film existing in the diaphragm portion may be completely removed.

As the lower electrode 15 and the upper electrode 17, a conductive film of molybdenum (Mo), tungsten (W), platinum (Pt), gold (Au) or the like is usable. Mo has a low thermal elastic loss which is about 1/56 of that of Al, and is therefore preferable especially for constituting the vibration portion which vibrates at a high frequency. It is also possible to use an alloy containing Mo or W as the main component (preferably the content is 80 atomic % or more), in addition to the case where Mo alone or W alone is used. The electrode may be used in which Mo, W, Pt, or Au is laminated with the substrate layer (adhesive layer) for enhancing the adhesion of titanium (Ti), zirconium (Zr), chromium (Cr) or the like. For example, a Mo/Ti laminated film, a W/Ti laminated film, a Mo/Zr laminated film, a Pt/Ti laminated film, an Au/Ti laminated film, an Au/Cr laminated film or the like is usable. The thickness of the lower electrode 15 or the upper electrode 17 is, for example, 50 to 250 nm. Examples of a method of forming the lower electrode 15 and the upper electrode 17 include a sputtering method or vacuum evaporation method. Furthermore, a photolithography technique is applied for forming a pattern into a desired shape if necessary.

The piezoelectric film 16 is constituted of a piezoelectric film containing a piezoelectric material selected from an aluminum nitride (AlN), an aluminum nitride-gallium nitride based solid solution ($Al_{1-x}Ga_xN$ (0<x<1)), zinc oxide (ZnO), lead titanate ($PT(PbTiO_3)$), lead zirconate titanate ($PZT(Pb(Zr, Ti)O_3)$) and the like as the main component. The piezoelectric thin film made of aluminum nitride-gallium nitride based solid solution ($Al_{1-x}Ga_xN$) and zinc oxide (ZnO) indicates a c-axis orientation, and a rocking curve half value width (FWHM) of a (0002) surface measured by an X-ray diffraction method is narrow. When the rocking curve half value width (FWHM) increases, and the orientation drops, an electromechanical coupling coefficient $K_t^2$ drops, there is a tendency that a pass bandwidth necessary for forming the device cannot be taken, and resonance characteristic tends to be deteriorated. The thickness of the piezoelectric film 16 is, for example, 0.5 to 2.5 μm. Examples of a method of depositing the piezoelectric film 16 include a reactive sputtering method, and further a photolithography technique for forming the pattern into the desired shape is applied if necessary.

Figure 4A:
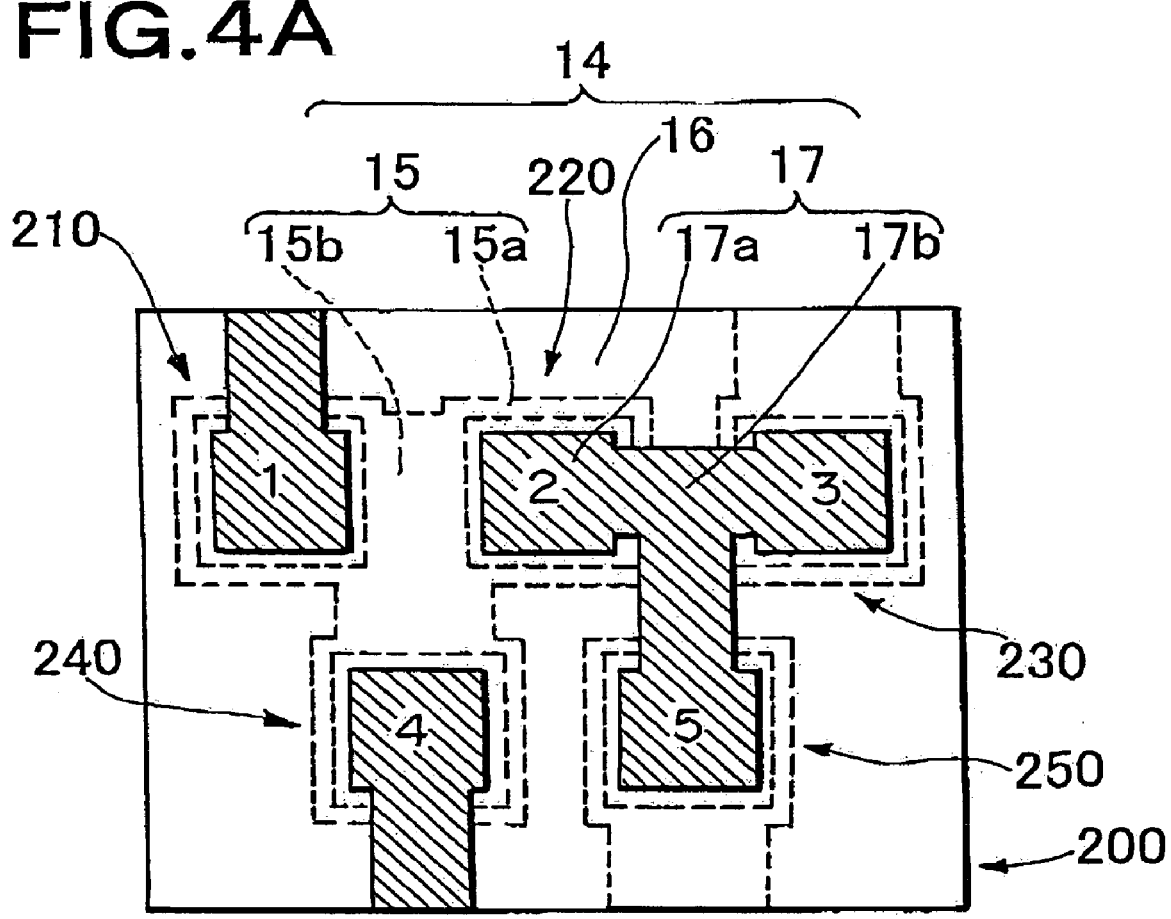
FIG. 4A is a schematic plan view showing still another embodiment of the thin film piezoelectric device according to the present invention.
Figure 4B:
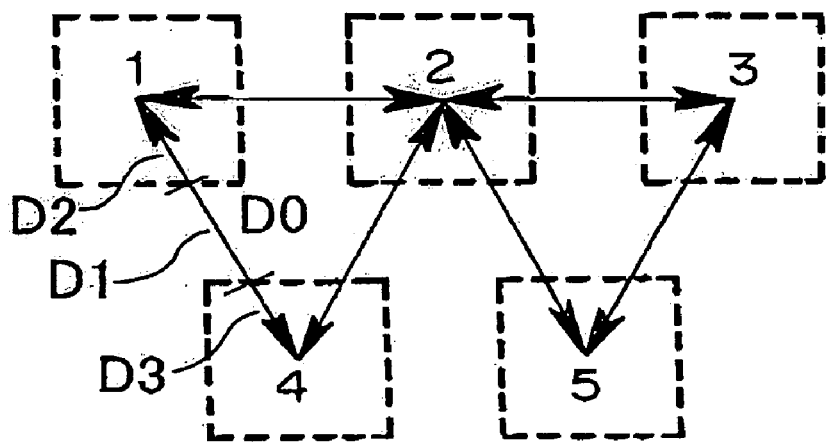
FIG. 4B is an explanatory diagram of a distance between centers of adjacent diaphragms in FIG. 4A.

FIG. 4A is a schematic plan view showing still another embodiment of the thin film piezoelectric device according to the present invention, and FIG. 4B is an explanatory diagram showing each distance between diaphragms. Also in these figures, members having functions similar to those in FIGS. 1A to 3B described above are denoted with the same reference numerals. A thin film piezoelectric device 220, of FIGS. 4A and 4B is prepared by combining an FBAR 210, an FBAR 220, an FBAR 230, an FBAR 240, and an FBAR 250.

In the present invention, in a straight line connected to centers (i.e., centers 1 to 5 of the diaphragm) of the electrically connected adjacent thin film piezoelectric resonators, a ratio D1/D0 is 0.1 to 0.5, where D1 is a length of a segment passing through the support area of the piezoelectric laminated structure on the straight line existing between the adjacent thin film piezoelectric resonators and D0 is a distance between the centers of the adjacent thin film piezoelectric resonators. A plurality of thin film piezoelectric resonators are arrangement in such positions, and formed into a device. In the thin film piezoelectric device 200 of FIGS. 4A and 4B, as to the straight line connected to the centers of the adjacent thin film piezoelectric resonators, assuming that the lengths of the segments passing through the diaphragms of the adjacent thin film piezoelectric resonators are D2, D3, and the length of the segment passing through the support area existing between the adjacent thin film piezoelectric resonators is D1, as shown in FIG. 4B, the distance D0 between the centers of the adjacent thin film piezoelectric resonators is represented by:

$$D0=D1+D2+D3.$$

Figure 5A:
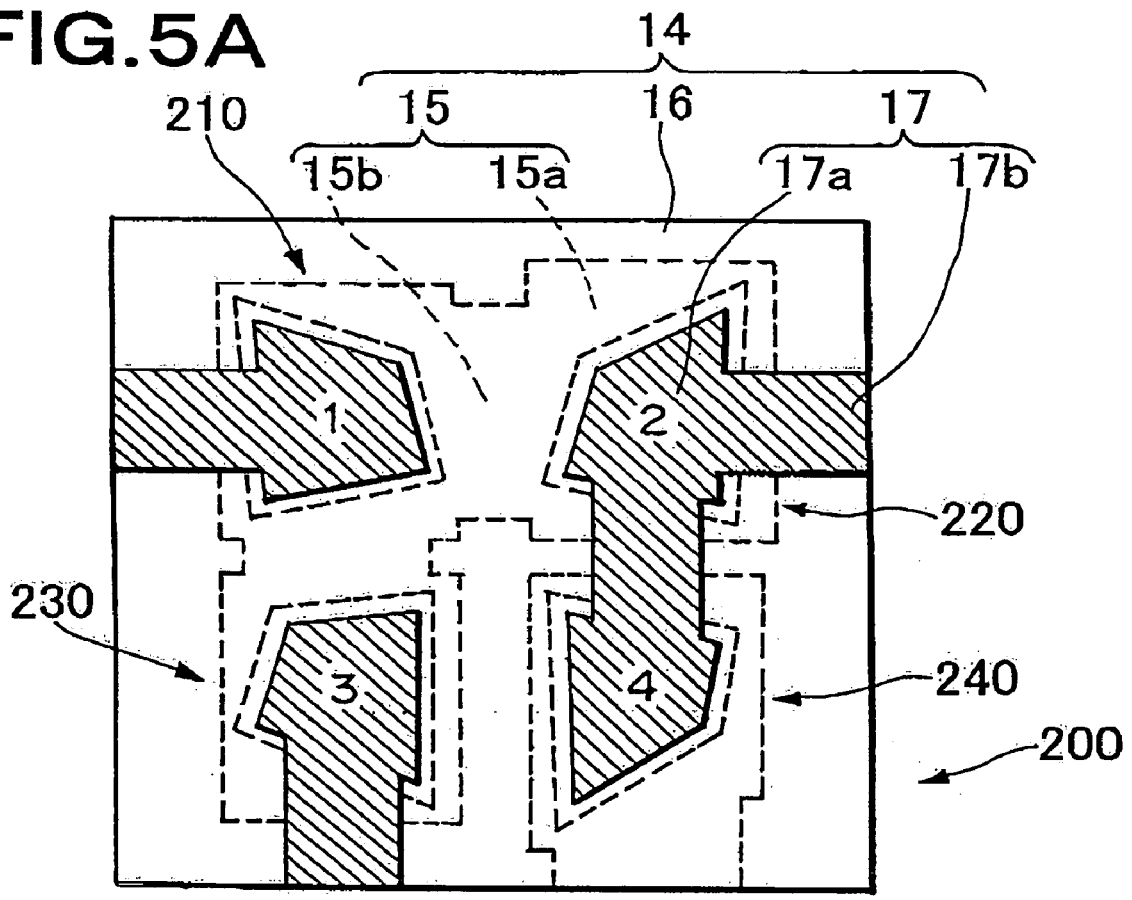
FIG. 5A is a schematic plan view showing still another embodiment of the thin film piezoelectric device according to the present invention.
Figure 5B:
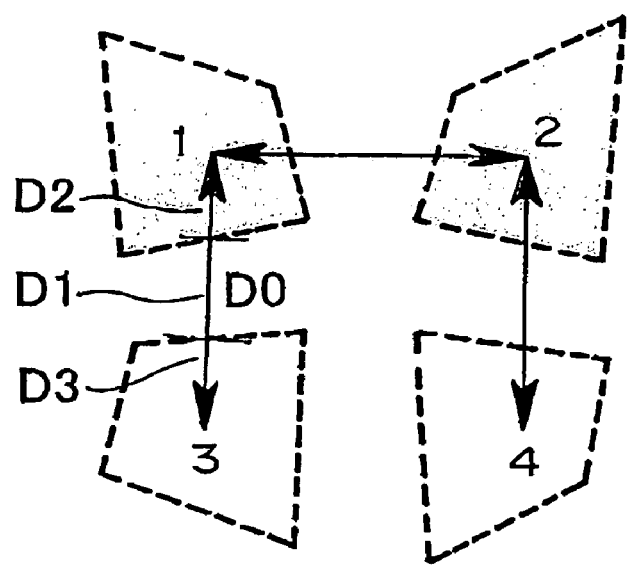
FIG. 5B is an explanatory diagram of the distance between the centers of the adjacent diaphragms in FIG. 5A.

FIG. 5A is a schematic plan view showing still another embodiment of the thin file piezoelectric device according to the present invention, and FIG. 5B is an explanatory diagram showing each distance between diaphragms. Also in these figures, members having functions similar to those in FIGS. 1A to 4B described above are denoted with the same reference numerals. A thin film piezoelectric device 200 of FIGS. 5A and 5B is prepared by combining an FBAR 210, an FBAR 220, an FBAR 230, and an FBAR 240.

In the thin film piezoelectric resonator of the present invention, the planar shape of the diaphragm constituting the vibration portion is devised and optimized. Accordingly, the thin film piezoelectric device is manufactured in which any extra spurious signal or noise does not enter a pass band and which has a low insertion loss and high characteristic and performance. Concrete examples of the preferable planar shape of the diaphragm include: a shape (quadrangle) having two pairs of opposite sides in such a manner that at least one pair of opposite sides are formed to be non-parallel; a polygonal shape including a non-square irregular polygonal shape in at least a part of the shape; a non-square irregular polygonal shape including a curved portion in at least a part of the shape and the like. The thin film piezoelectric device 200 of FIGS. 5A and 5B show an example of the quadrangle whose two pairs of opposite sides are both formed to be non-parallel. Also in the thin film piezoelectric device 200 of these figures, as to the straight line connected to the centers of the adjacent thin film piezoelectric resonators, assuming that the lengths of the segments passing through the diaphragms of the adjacent thin film piezoelectric resonators are D2, D3, and the length of the segment passing through the support area existing between the adjacent thin film piezoelectric resonators is D1, as shown in FIG. 5B, the distance D0 between the centers of the adjacent thin film piezoelectric resonators is represented by:

$$D0=D1+D2+D3.$$

In the embodiment of the thin film piezoelectric device shown in FIGS. 4A and 4B and FIGS. 5A and 5B, the FBAR 220 has a piezoelectric laminated structure 14 prepared on the upper surface of the substrate. The piezoelectric laminated structure 14 comprises a lower electrode 15 formed on the upper surface of the insulating layer, a piezoelectric film 16 formed on the upper surface of the insulating layer in such a manner as to coat the lower electrode 15, and an upper electrode 17 formed on the upper surface of the piezoelectric film 16. The lower electrode 15 and the upper electrode 17 have main body portions 15a, 17a formed in an area corresponding to the diaphragm 23, and terminal portions 15b, 17b for connection of the main body portions 15a, 17a to the other FBAR or an external circuit. The terminal portions 15b, 17b extend to the outside of the area corresponding to the diaphragm. This also applies to constitutions of the FBAR 210, FBAR 230, FBAR 240, and FBAR 250.

In the FBAR 210, FBAR 220, FBAR 230, and FBAR 240 shown in FIGS. 5A and 5B, the diaphragm constituting the vibration portion is formed in such a manner that the planar shape is a quadrangle whose two pairs of opposite sides are both non-parallel, and symmetry of the diaphragm is lowered. Accordingly, any extra spurious signal or noise cannot enter the desired pass band, and the performance of the thin film piezoelectric device for use as a high-frequency circuit component is enhanced.

Figure 9:
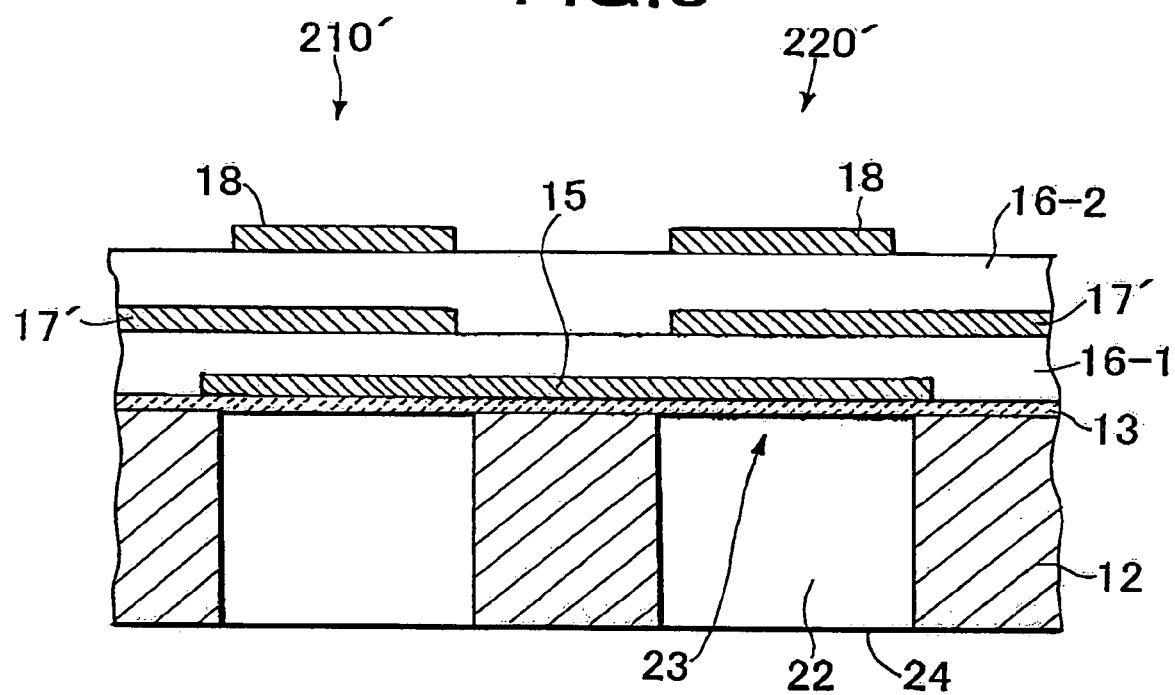
FIG. 9 is a schematic sectional plan view showing still another embodiment of the thin film piezoelectric device according to the present invention.

FIG. 9 is a schematic sectional plan view showing still another embodiment of the thin film piezoelectric device according to the present invention. Also in these figures, members having functions similar to those in FIGS. 1A to 5B described above are denoted with the same reference numerals.

The present embodiment has SBARs 210' and 220' each comprising a piezoelectric laminated structure corresponding to two laminated piezoelectric laminated structures described in the above embodiments. That is, a lower electrode 15, a first piezoelectric film 16-1, inner electrodes 17', a second piezoelectric film 16-2, and upper electrodes 18 are stacked in this order on an insulating layer 13. The inner electrode 17' has a function of an upper electrode with respect to the first piezoelectric film 16-1, and a function of a lower electrode with respect to the second piezoelectric film 16-2. In the present embodiment, in each SBAR, an input voltage is applied between the lower electrode 15 or the upper electrode 18 and the inner electrode 17', a voltage between the upper electrode 18 or the lower electrode 15 and the inner electrode 17' can be taken out as an output voltage, and this can be used as a multipolar filter.

SBARs 210', 220' are electrically connected to each other via the lower electrode 15. The SBARs 210', 220' may be electrically connected to each other via the upper electrode 18 or the inner electrode 17'.

Also in the present embodiment, a plurality of SBARs are arranged in positions where a ratio D1/D0 of a length D1 of a segment passing through a support area of a piezoelectric laminated structure in which a straight line exists between adjacent SBARs to a distance D0 between centers of the adjacent SBARs is 0.1 to 0.5 in the straight line connected to the centers of diaphragms 23 of electrically connected adjacent SBARs.

In each thin film piezoelectric resonator constituting the above-described thin film piezoelectric device, a resonant frequency fr and an antiresonant frequency fa in an impedance characteristic measured using a microwave prober, and an electromechanical coupling coefficient $K_t^2$ have the following relations:

$$K_t^2 = \phi r/\text{Tan}(\phi r); \text{ and}$$

$\phi r = (\pi/2)(fr/fa)$, where $\phi r$ indicates a change of a phase of a complex impedance.

For the sake of simplicity, the electromechanical coupling coefficient $K_t^2$ calculated from the following equation is usable:

$$K_t^2 = 4.8(fa-fr)/(fa+fr).$$

In the present description, a numeric value of the electromechanical coupling coefficient $K_t^2$ calculated using this equation is adopted.

The present inventors have studied dependence of the characteristics and performances of the thin film piezoelectric devices constituted as shown in FIGS. 1A to 1C, 2A to 2C, 3A and 3B, 4A and 4B, 5A and 5B, and 9 on structures and arrangements of FBARs, SBARs constituting the thin film piezoelectric devices. As a result, it has been found that the distance between the diaphragm centers of the electrically connected adjacent thin film piezoelectric resonators is shortened, preferably the planar shape of the diaphragm is optimized, accordingly the insertion loss attributable to the conductor loss of the metal electrode can be remarkably reduced, a plurality of thin film piezoelectric resonators having satisfactory resonance chartacteristics are integrated with high density, and a high-performance thin film piezoelectric device superior in gain and band characteristic can be realized.

In the thin film piezoelectric device of the present invention, the electromechanical coupling coefficient $K_t^2$ obtained from the measured values of the resonant frequency and the antiresonant frequency in the vicinity of 2.0 GHz is preferably more than 4.0%. When the electromechanical coupling coefficient is less than 4.0%, the bandwidth of the prepared thin film piezoelectric filter is reduced, and it tends to be difficult to practically use the device as a filter for use in a high frequency band. The insertion loss is preferably 3.0 dB or less. When the insertion loss exceeds 3.0 dB, the filter charcteristic is remarkably deteriorated, and it tends to be difficult to practically use the device as the filter for use in the high frequency band.

EXAMPLES

The present invention will be described hereinafter in more detail in accordance with examples and comparative examples.

Example 1

In the present example, a thin film piezoelectric filter shown in FIGS. 2A to 2C was prepared as follows.

That is, the upper surface of a (100) Si substrate 12 having a thickness of 250 μm was patterned and etched into a desired shape by photolithography, so that a depression was disposed in periphery thereof in such a manner that a flat base having a nearly rectangular shape with a height of 3.0 μm and a planar dimension of about 140×160 μm was left. It is to be noted that the base was formed in a position corresponding to a diaphragm of an resonator to be formed. After forming $SiO_2$ layers each having a thickness of 1.0 μm on opposite upper/lower surfaces of a substrate by a thermal oxidation method, an $SiO_2$ layer having a thickness of 3.5 μm was deposited on the upper surface of the substrate at 450° C. by a thermal CVD method using tetraethoxy silane ($Si(O(C_2H_5)_4)$) in a raw material, and annealed at 1000° C. Next, the $SiO_2$ layer on the upper surface of the substrate was polished by a chemical mechanical polishing (CMP) process using a slurry containing fine polishing particles, an $SiO_2$ layer was completely removed from a region except a portion whose depression was filled with the $SiO_2$ layer, and a surface state was obtained in which an Si substrate portion having the flat base shape was exposed to the outside. An RMS roughness of a height of the polished surface was 10 nm. After the exposed portion of the Si substrate was etched/removed by a depth of about 0.3 μm using the $SiO_2$ layer exposed to the surface as a bask, a Ti metal layer (adhesive layer) and a Mo metal layer (main electrode layer) were deposited in this order by a DC magnetron sputtering method, and a lower electrode film containing Mo having a material and a thickness described in Table 1 as a main material was formed. The lower electrode film was patterned into a desired shape by photolithography, and a Mo/Ti lower electrode 15 was formed. A main body portion 15a of the lower electrode 15 of each FBAR was formed into a nearly rectangular shape whose each side was larger than that of the diaphragm having a planar dimension of 140×160 μm by about 15 μm. It was confirmed by X-ray diffraction measurement that the Mo metal layer constituting the lower electrode 15 was a (110) oriented film, that is, a single orientation film. An AlN piezoelectric thin film having a thickness described in Table 2 was deposited on the substrate 12 on which the Mo/Ti lower electrode 15 was deposited on conditions described in Table 1 by a reactive RF magnetron sputtering method using metal Al having a purity of 5N as a target. The AlN film was patterned into a specific shape by wet etching using hot phosphoric acid, and an AlN piezoelectric film 16 was formed. Thereafter, as shown in FIGS. 2A to 2C, an upper electrode 17 was deposited using the DC magnetron sputtering method and a lift-off process for patterning, in which the thickness was 0.180 μm for a series circuit and 0.209 μm for a shunt circuit, and a main body portion 17a had a nearly rectangular shape whose each side was smaller than that of the diaphragm by about 5 μm. The main body portion 17a of the upper electrode 17 was disposed in a position corresponding to the lower electrode main body portion 15a.

The SiO$_2$ layer on the lower surface of the substrate 12 on which a piezoelectric laminated structure 14 was formed as described above was patterned into a predetermined shape in accordance with the SiO$_2$ mask on the upper surface by the photolithography. Furthermore a micro machine working photo resist (NANO SU-8-negative resist manufactured by MicroChem Corp.) was applied, and a resist mask having the same shape as that of the lower-surface SiO$_2$ mask was formed by the photolithography. The substrate 12 on which the mask was formed was charged into a dry etching equipment having a deep graving type reactive ion etching (deep RIE) specification, and an SF$_6$ gas and a C$_4$F$_8$ gas were alternately introduced into the equipment to repeat the etching and formation of a side wall protective film. An etching speed ratio of a side wall surface to a bottom surface was controlled, and the etching was continued at a speed of several micrometers per minute. Accordingly, the etching was performed until the lower electrode 15 was exposed to a via hole 22, and the deep prismatic via hole 22 whose side wall surface was vertically disposed was prepared. As a result, it was possible to form the diaphragm 23 into a planar shape and a dimension substantially equal to those of an opening 24 in the lower surface of the substrate. A value of a ratio D1/D0 of a length D1 of a segment passing through a support area of the piezoelectric laminated structure in which a straight line passing through the centers of the diaphragms of two electrically connected adjacent thin film piezoelectric resonators existed between the diaphragms of the adjacent thin film piezoelectric resonators to a distance D0 between the centers of the diaphragms of two adjacent thin film piezoelectric resonators was 0.18. The value of this ratio D1/D0 indicates that of representative one set of electrically connected adjacent thin film piezoelectric resonators, but the value of the ratio D1/D0 was in a range of 0.18 to 0.3 also with respect to another set of electrically connected adjacent thin film piezoelectric resonators. Tapered angle or club-shaped angles of side wall surfaces of all via holes were in a range of 80 to 100° with respect to the upper surface of the substrate.

With respect to thin film piezoelectric filter manufactured by the above-described steps and constituted of the ladder type circuit having the structure of FIGS. 2A to 2C, a lattice constant of an AlN thin film, and a rocking curve half value width (FWHM) of a (0002) diffraction peak were measured by a diffractometer method. Evaluation results of the degree of crystal orientation of the AlN thin film are shown in Table 1.

TABLE 1

| | Material and thickness of metal electrode | | | | | | |
|---|---|---|---|---|---|---|---|
| | Lower electrode | | | | Upper electrode | | |
| | Adhesive layer material | Intermediate layer material | Main Electrode layer material | Thickness (nm) | Adhesive layer material | Main electrode layer material | Thickness (nm)* |
| Example 1 | Ti | — | Mo | 200 | — | Mo | 180 / 208 |
| Example 2 | Ti | Pt | Mo | 230 | Ti | Mo | 210 / 244 |
| Example 3 | Ti | Au | Mo | 210 | — | Mo | 190 / 225 |
| Example 4 | V | Au | Mo (TZM alloy) | 220 | — | Mo (TZM alloy) | 200 / 235 |
| Example 5 | Ti | Al | Mo | 225 | — | Mo | 205 / 237 |
| Example 6 | Ti | Au | Mo | 210 | Ti | Mo | 190 / 228 |
| Example 7 | Ti | — | Mo | 195 | — | Al | 175 / 196 |
| Example 8 | Ti | — | Au | 170 | — | Au | 150 / 180 |
| Example 9 | Ti | Pt | Mo (TZM alloy) | 235 | Ti | Mo (TZM alloy) | 215 / 250 |
| Example 10 | Zr | Au | Mo | 205 | Zr | Mo | 185 / 219 |
| Example 11 | Ti | — | Pt | 220 | Ti | Pt | 200 / 240 |
| Example 12 | Ni | Al | W | 225 | — | Al | 205 / 222 |
| Example 13 | Nb | Pt | W—Mo alloy | 210 | Nb | W—Mo alloy | 190 / 223 |
| Example 14 | Hf | — | Pt | 210 | — | Pt | 190 / 211 |
| Comparative example 1 | Ni | — | Mo—Re alloy | 195 | — | Mo—Re alloy | 175 / 205 |
| Comparative example 2 | Ti | — | Mo | 230 | Ti | Mo | 210 / 243 |
| Comparative example 3 | Ti | — | Au | 160 | — | Au | 140 / 158 |
| Comparative example 4 | Zr | Au | Mo | 210 | — | Mo | 190 / 218 |

TABLE 1-continued

| | Preparation conditions and characteristics of piezoelectric thin film | | | | | |
|---|---|---|---|---|---|---|
| | | Thin film depositing conditions | | Crystal orientation | Structure of thin-film piezoelectric device | |
| | | Nitrogen | Substrate | | | Insulating layer |
| | Material | concentration (vol %) | temperature (° C.) | rocking curve FWHM(deg) | Structure drawing | Material | Thickness (μm)** |
|---|---|---|---|---|---|---|---|
| Example 1 | AlN | 30 | 350 | 2.4 | FIG. 2 | SiO$_2$ | 0.00 |
| Example 2 | AlN | 35 | 300 | 1.8 | FIG. 2 | SiO$_2$ | 0.00 |
| Example 3 | AlN | 25 | 325 | 1.6 | FIG. 1 | SiO$_2$ | 0.25 |
| Example 4 | (Al,Ga)N | 35 | 340 | 1.9 | FIG. 1 | SiO$_2$ | 0.35 |
| Example 5 | AlN | 50 | 315 | 1.7 | FIG. 2 | SiO$_2$ | 0.00 |
| Example 6 | AlN | 50 | 305 | 1.4 | FIG. 2 | SiO$_2$ | 0.00 |
| Example 7 | AlN | 25 | 250 | 2.6 | FIG. 2 | SiO$_2$ | 0.00 |
| Example 8 | ZnO | — | 240 | 2.3 | FIG. 3 | SiO$_2$ | 0.30 |
| Example 9 | AlN | 45 | 340 | 2.0 | FIG. 1 | SiN$x$ | 0.30 |
| Example 10 | AlN | 35 | 280 | 2.2 | FIG. 2 | SiO$_2$ | 0.00 |
| Example 11 | PZT | — | 600 | — | FIG. 1 | SiN$x$ | 0.43 |
| Example 12 | AlN | 30 | 250 | 4.0 | FIG. 1 | SiN$x$ | 0.40 |
| Example 13 | (Al,Ga)N | 50 | 270 | 3.5 | FIG. 1 | SiO$_2$ | 0.20 |
| Example 14 | ZnO | — | 270 | 3.6 | FIG. 2 | SiO$_2$ | 0.00 |
| Comparative example 1 | AlN | 45 | 345 | 3.2 | FIG. 1 | SiO$_2$ | 0.38 |
| Comparative example 2 | AlN | 45 | 270 | 2.9 | FIG. 8 | SiO$_2$ | 0.35 |
| Comparative example 3 | ZnO | — | 260 | 3.0 | FIG. 8 | SiO$_2$ | 0.40 |
| Comparative example 4 | AlN | 40 | 260 | 2.8 | FIG. 2 | SiO$_2$ | 0.00 |

*Upper stage indicates thickness of upper electrode in series circuit, lower stage indicates thickness of upper electrode in shunt circuit.
**Thickness of insulating layer in diaphragm portion is described.

Moreover, an impedance characteristic between the electrode terminals 15*b*, 17*b* of the FBAR constituting the thin film piezoelectric filter comprising a ladder type circuit was measured using a microwave prober and a network analyzer manufactured by Cascade Microtech Inc. Moreover, an electromechanical coupling coefficient $K_t^2$ and an acoustic quality factor Q were obtained from measured values of a resonant frequency fr and antiresonant frequency fa.

The resonant frequency fr, antiresonant frequency fa, and electromechanical coupling coefficient $K_t^2$ in the resonance characteristic measured using the microwave prober have the following relation:

$$K_t^2 = \phi r / \text{Tan}(\phi r); \text{ and}$$

$$\phi r = (\pi/2)(fr/fa),$$

where $\phi r$ indicates a change of a phase of a complex impedance.

For the sake of simplicity, the electromechanical coupling coefficient $K_t^2$ was calculated from the following equation:

$$K_t^2 = 4.8(fa-fr)/(fa+fr).$$

A basic frequency of thickness vibration, the electromechanical coupling coefficient $K_t^2$, and the acoustic quality factor Q of the obtained thin film piezoelectric filter are as shown in Table 2.

TABLE 2

| | | Structure of thin-film piezoelectric device | | | | | Characteristics of thin-film piezoelectric resonator* | |
|---|---|---|---|---|---|---|---|---|
| | | | Distance between adjacent diaphragm | | | Thickness of piezoelectric thin film (μm) | Resonant frequency (GHz) | Antiresonant frequency (GHz) |
| | Diaphragm shape | D1 (μm) | D2 + D3 (μm) | D0 (μm) | D1/D0 | | | |
| Example 1 | Rectangular | 34 | 150 | 184 | 0.18 | 1.17 | 2.65 / 2.59 | 2.72 / 2.65 |
| Example 2 | Trapezoidal | 35 | 150 | 185 | 0.19 | 1.32 | 2.45 / 2.39 | 2.51 / 2.45 |
| Example 3 | Trapezoidal | 35 | 150 | 185 | 0.19 | 1.50 | 1.91 / 1.87 | 1.96 / 1.91 |
| Example 4 | Rectangular | 33 | 135 | 168 | 0.20 | 1.30 | 1.85 / 1.81 | 1.89 / 1.85 |
| Example 5 | Rectangular | 50 | 160 | 210 | 0.24 | 1.40 | 2.36 / 2.30 | 2.42 / 2.36 |

TABLE 2-continued

| | | | | | | | |
|---|---|---|---|---|---|---|---|
| Example 6 | Pentangular | 53 | 170 | 223 | 0.24 | 1.57 | 2.12 | 2.18 |
| | | | | | | | 2.06 | 2.12 |
| Example 7 | Non-orthogonal shape Including curves | 50 | 150 | 200 | 0.25 | 1.05 | 2.32 | 2.37 |
| | | | | | | | 2.26 | 2.32 |
| Example 8 | Rectangular | 44 | 180 | 224 | 0.20 | 0.98 | 1.35 | 1.39 |
| | | | | | | | 1.31 | 1.35 |
| Example 9 | Rectangular | 38 | 160 | 198 | 0.19 | 1.20 | 2.20 | 2.25 |
| | | | | | | | 2.15 | 2.20 |
| Example 10 | Trapezoidal | 35 | 150 | 185 | 0.19 | 1.40 | 2.25 | 2.31 |
| | | | | | | | 2.20 | 2.25 |
| Example 11 | Rectangular | 50 | 150 | 200 | 0.25 | 0.58 | 1.72 | 1.78 |
| | | | | | | | 1.67 | 1.72 |
| Example 12 | Rectangular | 55 | 175 | 230 | 0.24 | 0.99 | 2.06 | 2.09 |
| | | | | | | | 2.03 | 2.06 |
| Example 13 | Rectangular | 40 | 165 | 205 | 0.20 | 1.30 | 2.16 | 2.20 |
| | | | | | | | 2.12 | 2.16 |
| Example 14 | Rectangular | 35 | 140 | 175 | 0.20 | 1.02 | 1.89 | 1.93 |
| | | | | | | | 1.86 | 1.89 |
| Comparative example 1 | Trapezoidal | 180 | 150 | 330 | 0.55 | 1.00 | 2.14 | 2.19 |
| | | | | | | | 2.10 | 2.14 |
| Comparative example 2 | Rectangular | 450 | 160 | 610 | 0.74 | 1.05 | 2.09 | 2.13 |
| | | | | | | | 2.05 | 2.09 |
| Comparative example 3 | Rectangular | 450 | 150 | 600 | 0.75 | 0.41 | 1.70 | 1.74 |
| | | | | | | | 1.67 | 1.70 |
| Comparative example 4 | Rectangular | 20 | 190 | 210 | 0.095 | 1.50 | 2.29 | 2.34 |
| | | | | | | | 2.24 | 2.29 |

| | Characteristics of thin-film piezoelectric resonator* | | Performance of thin-film piezoelectric device | | | |
|---|---|---|---|---|---|---|
| | Electromechanical coupling coefficient $K_t^2$(%) | Acoustic quality factor Q-Value | Type of device | Pass bandwidth (MHz) | Insertion Loss I.L. (dB) | Inhibition region attenuation amount (dB) |
| Example 1 | 5.92 | 1012 | Ladder-type filter | 66.3 | 1.8 | 45.6 |
| Example 2 | 6.19 | 1256 | Ladder-type filter | 64.0 | 1.4 | 47.0 |
| Example 3 | 5.29 | 1757 | Ladder-type filter | 42.6 | 1.3 | 51.9 |
| Example 4 | 5.13 | 1556 | Ladder-type filter | 40.0 | 1.7 | 49.8 |
| Example 5 | 6.27 | 1065 | Ladder-type filter | 62.5 | 2.0 | 46.1 |
| Example 6 | 6.50 | 1188 | Ladder-type filter | 58.2 | 1.7 | 47.3 |
| Example 7 | 5.88 | 941 | Ladder-type filter | 57.5 | 1.3 | 45.6 |
| Example 8 | 6.98 | 650 | Ladder-type filter | 39.8 | 1.9 | 45.3 |
| Example 9 | 5.64 | 1351 | Ladder-type filter | 52.3 | 2.3 | 46.0 |
| Example 10 | 5.99 | 1100 | Duplexer (ladder-type filter)** | 56.9 | 1.4 | 46.3 |
| Example 11 | 8.13 | 189 | Ladder-type filter | 59.4 | 2.9 | 24.0 |
| Example 12 | 4.00 | 825 | Ladder-type filter | 34.6 | 1.6 | 39.7 |
| Example 13 | 4.27 | 872 | Ladder-type filter | 38.8 | 2.0 | 40.2 |
| Example 14 | 4.33 | 500 | Ladder-type filter | 34.5 | 2.5 | 35.4 |
| Comparative example 1 | 4.84 | 456 | Ladder-type filter | 43.7 | 5.0 | 26.2 |
| Comparative example 2 | 4.96 | 539 | Ladder-type filter | 43.6 | 8.0 | 28.8 |
| Comparative example 3 | 5.18 | 276 | Ladder-type filter | 37.1 | 6.0 | 25.1 |
| Comparative example 4 | 5.20 | — | Broken during processing and cannot be formed into device. | | | |

*Upper stage indicates frequency characteristic of FBAR in series circuit, lower stage indicates frequency characteristics of FBAR in shunt circuit.
**As to duplexer, performance of Tx (transmission side) is described.

Furthermore, pass band characteristics of a signal of the above-described thin film piezoelectric filter comprising the ladder type circuit was measured using the microwave prober manufactured by Cascade Microtech Inc. and network analyzer, and performances (pass bandwidth, insertion loss, attenuation amount at inhibition region) of the filter were evaluated. The pass bandwidth, insertion loss I. L., and attenuation amount at inhibition region of the obtained thin film piezoelectric filter are as shown in Table 2.

Example 2

In the present example, a thin film piezoelectric filter having the structure (the diaphragm 23 is trapezoidal) shown in FIG. 2 was prepared as follows.

That is, an procedure similar to that of Example 1 was repeated to prepare the thin film piezoelectric filter comprising the ladder type circuit except that a Ti metal layer (adhesive layer), a Pt metal layer (intermediate layer), and a Mo metal layer (main electrode layer) were deposited as a lower electrode in this order to form a Mo/Pt/Ti lower electrode 15 having a material and thickness described in Table 1, a Ti metal layer (adhesive layer) and a Mo metal layer (main electrode layer) were deposited as an upper electrode in this order to form a Mo/Ti upper electrode 17 having a material and thickness described in Table 1, and the planar shape of a via hole fabricated by deep RIE was formed to be trapezoidal to thereby form a diaphragm 23 into a trapezoidal shape. The above described D1/D0 of the present example was 0.19. The value of this ratio D1/D0 indicates that of representative one set of electrically connected adjacent thin film piezoelectric resonators, but the value of the ratio D1/D0 was in a range of 0.18 to 0.3 also with respect to another set of electrically connected adjacent thin film piezoelectric resonators. Tapered angle or club-shaped angles of side wall surfaces of all via holes were in a range of 80 to 100° with respect to the upper surface of the substrate 5.

With respect to the thin film piezoelectric filter manufactured by the above-described steps and constituted of the ladder type circuit having the structure of FIG. 2 (the diaphragm 23 was trapezoidal), a lattice constant of an AlN thin film and a rocking curve half value width (FWHM) of a (0002) diffraction peak were measured by a diffractometer method in the same manner as in Example 1. Evaluation results of the degree of crystal orientation of the AlN thin film are shown in Table 1.

Moreover, an electromechanical coupling coefficient $K_t^2$ and an acoustic quality factor Q were obtained from measured values of a resonant frequency fr and antiresonant frequency fa of an FBAR constituting the above-described thin film piezoelectric filter comprising the ladder type circuit using a microwave prober manufactured by Cascade Microtech Inc. and a network analyzer in the same manner as in Example 1. A basic frequency of thickness vibration, the electromechanical coupling coefficient $K_t^2$, and the acoustic quality factor Q of the obtained thin film piezoelectric filter are as shown Table 2.

Furthermore, pass band characteristic of a signal of the above-described thin film piezoelectric filter comprising the ladder type circuit was measured, and performances (pass bandwidth, insertion loss, attenuation amount at inhibition region) of the filter were evaluated in the same manner as in Example 1. The pass bandwidth, insertion loss I. L., and attenuation amount at inhibition region of the obtained thin film piezoelectric filter are as shown in Table 2.

Example 3

In the present example, a thin film piezoelectric filter having the structure (the diaphragm 23 was trapezoidal) shown in FIG. 1 was prepared as follows.

That is, after forming SiO$_2$ layers each having a thickness of 1.2 μm on opposite upper/lower surfaces of a (100) Si substrate 12 having a thickness of 250 μm by a thermal oxidation method, the only SiO$_2$ layer on the upper surface was etched to adjust the thickness of the SiO$_2$ layer on the upper surface, and an insulating layer 13 made of SiO$_2$ and having a thickness value described in Table 1 was formed. A Ti metal layer (adhesive layer), an Au metal layer (intermediate layer), and a Mo metal layer (main electrode layer) were deposited on the upper surface of the insulating layer 13 in this order by a DC magnetron sputtering method, and patterned into a desired shape by photolithography to form a Mo/Au/Ti lower electrode 15. A main body portion 15a of the lower electrode 15 was formed into a nearly rectangular shape. It was confirmed by X-ray diffraction measurement that the Mo metal layer was a (110) oriented film, that is, a singly oriented film. An AlN piezoelectric thin film having a thickness described in Table 2 was formed on the insulating layer 13 on which the Mo lower electrode 15 was deposited on conditions described in Table 1 by a reactive RF magnetron sputtering method using metal Al having a purity of 5N as a target. The AlN film was patterned into a specific shape by wet etching using hot phosphoric acid, and an AlN piezoelectric film 16 was formed. Thereafter, as shown in FIG. 1, an upper electrode 17 was deposited using the DC magnetron sputtering method and a lift-off process, in which the thickness was 0.190 μm for a series circuit and 0.225 μm for a shunt circuit, and a main body portion 17a had a nearly rectangular shape whose planar area was around 23,000 μm$^2$. The main body portion 17a of the upper electrode 17 was disposed in a position corresponding to the lower electrode main body portion 15a.

The SiO$_2$ layer on the lower surface of the substrate 12 on which a piezoelectric laminated structure 14 was formed as described above was patterned into a predetermined shape in accordance with the upper electrode main body portion 17a by the photolithography. Furthermore, a micro machine working photo resist (NANO SU-8 negative resist manufactured by MicroChem Corp.) was applied, and a resist mask having the same shape as that of the lower-surface SiO$_2$ mask was formed by the photolithography. The substrate 12 on which the mask was formed was charged into a dry etching equipment having a deep graving type reactive ion etching (deep RIE) specification, and an SF$_6$ gas and a C$_4$F$_8$ gas were alternately introduced into the equipment to repeat the etching and formation of a side wall protective film. An etching speed ratio of a side wall surface to a bottom surface was controlled, and the etching was continued at a speed of several micrometers per minute. Accordingly, the etching was performed until the lower electrode main body portion 15a was exposed to a via hole 22, and the deep prismatic via hole 22 whose side wall surface was vertically disposed was prepared. As a result, it was possible to form the diaphragm 23 into a planar shape and a dimension substantially equal to those of an opening 24 in the substrate back surface. The above-described D1/D0 of the present example was 0.19. The value of this ratio D1/D0 indicates that of representative one set of electrically connected adjacent thin film piezoelectric resonators, but the value of the ratio D1/D0 was in a range of 0.18 to 0.3 also with respect to another set of electrically connected adjacent thin film piezoelectric resonators. Tapered angle or club-shaped angles of side wall surfaces of all via holes were in a range of 80 to 100° with respect to the upper surface of the substrate.

With respect to the thin film piezoelectric filter manufactured by the above-described steps and constituted of the ladder type circuit having the structure of FIG. 1, the degree of crystal orientation of the AlN thin film was evaluated in the same manner as in Example 1. The evaluation results are shown in Table 1.

Moreover, an electromechanical coupling coefficient $K_t^2$ and an acoustic quality factor Q were obtained from measured values of a resonant frequency fr and antiresonant frequency fa of an FBAR constituting the above-described thin film piezoelectric filter comprising the ladder type circuit using a microwave prober and a network analyzer manufactured by cascade Microtech Inc. in the same manner as in Example 1. A basic thickness vibration, the electromechanical coupling coefficient $K_t^2$, and the acoustic quality factor Q of the obtained thin film piezoelectric filter are as shown in Table 2.

Furthermore, pass band characteristic of a signal of the above-described thin film piezoelectric filter comprising the ladder type circuit was measured, and performances (pass bandwidth, insertion loss, attenuation amount at inhibition region) of the filter were evaluated in the same manner as in Example 1. The pass bandwidth, insertion loss I. L., and attenuation amount at inhibition region of the obtained thin film piezoelectric filter are as shown in Table 2.

Example 4

In the present example, a thin film piezoelectric filter having the structure shown in FIG. 1 was prepared as follows.

That is, an procedure similar to that of Example 3 was repeated to prepare the thin film piezoelectric filter comprising the ladder type circuit except that a V metal layer (adhesive layer), an Au metal layer (intermediate layer), and a TZM alloy layer (main electrode layer) were formed as a lower electrode in this order to form a Mo (TZM alloy)/Au/V lower electrode 15 having a material and thickness described in Table 1, an aluminum nitride-gallium nitride based solid solution ($Al_{1-x}Ga_xN$) having a thickness described in Table 2 was formed on an insulating layer 13 on which the Mo (TZM alloy)/Au/V lower electrode 15 was formed by a reactive RF magnetron sputtering method on conditions described in Table 1, a Mo (TZM alloy) upper electrode 17 having a material and a thickness described in Table 1 was formed as an upper electrode, and the planar shape of a via hole fabricated by deep RIE was formed to be rectangular to thereby form a diaphragm 23 into a rectangular shape. The above-described D1/D0 of the present example was 0.20. The value of this ratio D1/D0 indicates that of representative one set of electrically connected adjacent thin film piezoelectric resonators, but the value of the ratio D1/D0 was in a range of 0.18 to 0.3 also with respect to another set of electrically connected adjacent thin film piezoelectric resonators. Tapered angle or club-shaped angles of side wall surfaces of all via holes were in a range of 80 to 100° with respect to the upper surface of the substrate.

With respect to the thin film piezoelectric filter manufactured by the above-described steps and constituted of the ladder type circuit having the structure of FIG. 1, the degree of crystal orientation of the AlN thin film was evaluated in the same manner as in Example 3. The evaluation results are shown in Table 1.

Moreover, an impedance characteristic and pass band characteristic of the signal of the thin film piezoelectric filter comprising the ladder type circuit were measured using a microwave prober and a network analyzer manufactured by Cascade Microtech Inc. in the same manner as in Example 3. An electromechanical coupling coefficient $K_t^2$ and an acoustic quality factor Q were obtained from measured values of a resonant frequency fr and antiresonant frequency fa, and performances (pass bandwidth, insertion loss, attenuation amount at inhibition region) of the filter were evaluated. A basic frequency of thickness vibration, the electromechanical coupling coefficient $K_t^2$, and the acoustic quality factor Q of the obtained thin film piezoelectric filter are as shown in Table 2. Furthermore, the pass bandwidth, insertion loss I. L., and attenuation amount at inhibition region of the filter are as shown in Table 2.

Examples 5 to 7

In the present examples, a thin film piezoelectric filter having the structure (the diaphragm 23 had a shape described in Table 1) shown in FIG. 2 was prepared as follows.

That is, an procedure similar to that of Example 1 was repeated to prepare the thin film piezoelectric filter comprising a ladder type circuit except that a Ti adhesive layer, an intermediate layer, and a Mo metal layer (main electrode layer) described in Table 1 were formed as a lower electrode in this order to form a Mo/Al/Ti, Mo/Au/Ti, or Mo/Ti lower electrode 15 having a material and thickness described in Table 1, an upper electrode 17 having a material and thickness described in Table 1 and made of Mo, Mo/Ti, or Al was formed, and the shape of a diaphragm 23 was formed into a shape described in Table 1 based on the planar shape of a via hole fabricated by deep RIE. The above-described D1/D0 of the present examples was 0.24 to 0.25 as shown in Table 2. The value of this ratio D1/D0 indicates that of representative one set of electrically connected adjacent thin film piezoelectric resonators, but the value of the ratio D1/D0 was in a range of 0.18 to 0.3 also with respect to another set of electrically connected adjacent thin film piezoelectric resonators. Tapered angle or club-shaped angles of side wall surfaces of all via holes were in a range of 80 to 100° with respect to the upper surface of the substrate.

With respect to the thin film piezoelectric filter manufactured by the above-described steps and constituted of the ladder type circuit having the structure of FIG. 2 (the diaphragm 23 had a shape described in Table 1), the degree of crystal orientation of the AlN thin, film was evaluated in the same manner as in Example 1. The evaluation results are shown in Table 1.

Moreover, an impedance characteristic and pass band characteristic of the signal of the above-described thin film piezoelectric filter comprising the ladder type circuit were measured using a microwave prober and a network analyzer manufactured by Cascade Microtech Inc. in the same manner as in Example 3, and an electromechanical coupling coefficient $K_t^2$ and an acoustic quality factor Q were obtained from measured values of a resonant frequency fr and antiresonant frequency fa. Moreover, performances (pass bandwidth, insertion loss, attenuation amount at inhibition region) of the filter were evaluated. A basic frequency of thickness vibration, the electromechanical coupling coefficient $K_t^2$, and the acoustic quality factor Q of the obtained thin film piezoelectric filter are as shown in Table 2. The pass bandwidth, insertion loss I. L., and attenuation amount at inhibition region of the obtained thin film piezoelectric filter are as shown in Table 2.

Figure 6A:
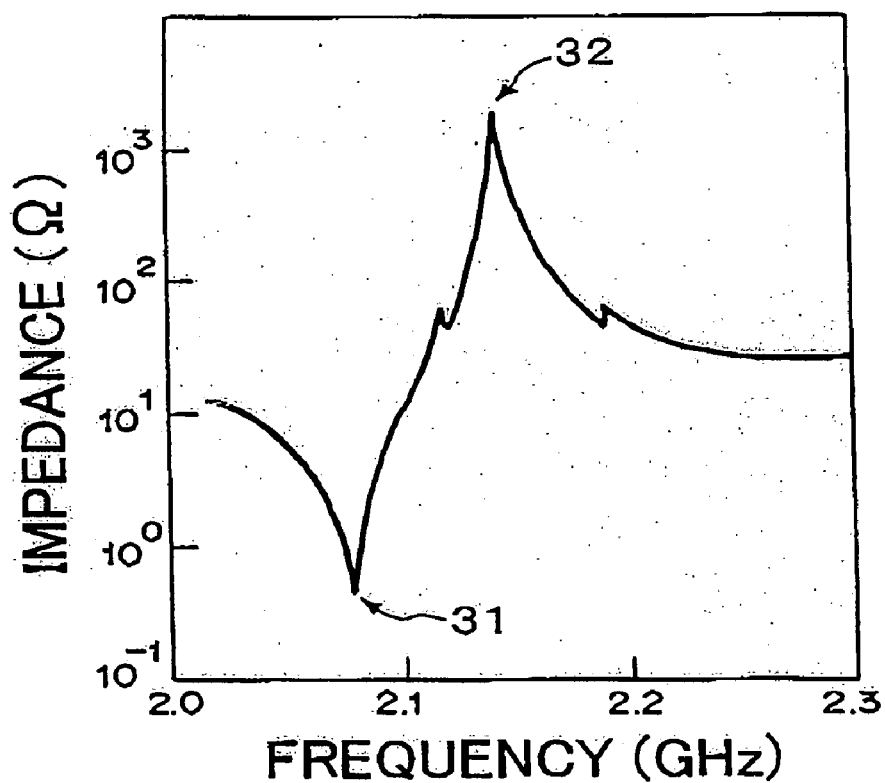
FIG. 6A is a graph showing an impedance frequency characteristic of the thin film piezoelectric device of Example 6.
Figure 6B:
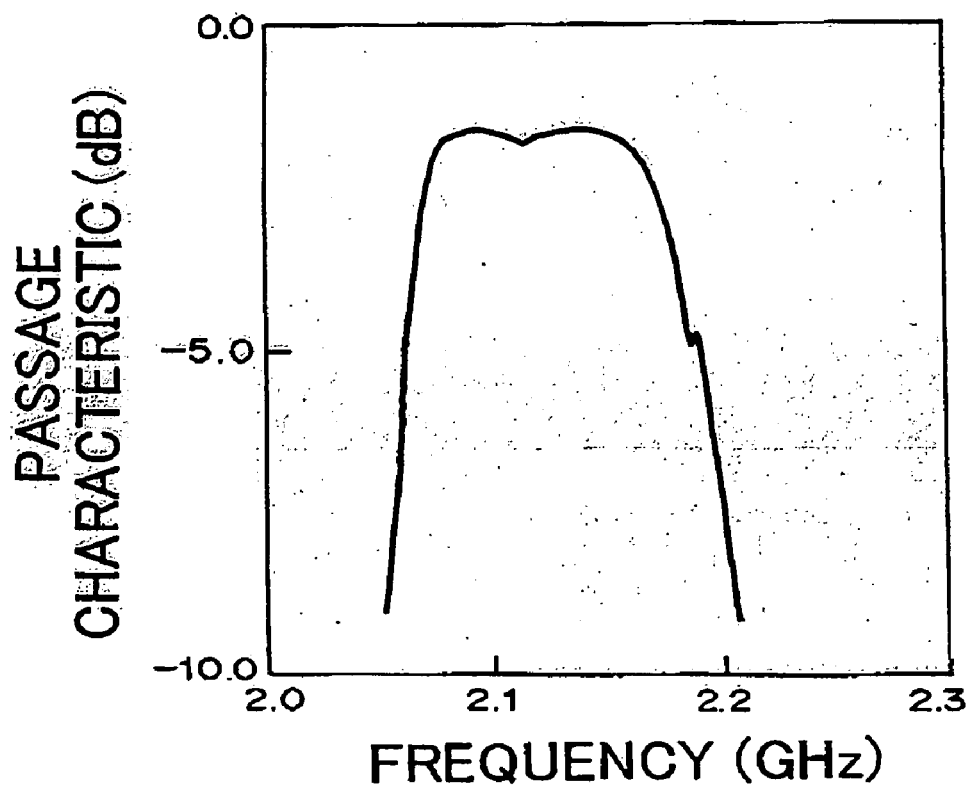
FIG. 6B is a graph showing a filter pass band characteristic of the thin film piezoelectric device of Example 6.

FIGS. 6A and 6B show an impedance frequency characteristic and a filter pass band characteristic of the thin film piezoelectric filter in Example 6. In the thin film piezoelectric filter of the present example, a fine peak between a resonant frequency peak 31 and an antiresonant frequency peak 32 is remarkably little, and the pass band characteristic is remarkably satisfactory as shown in FIG. 6A. This satisfactory pass band characteristic depends on a diaphragm shape which is an asymmetric pentagonal shape.

Example 8

In the present example, a thin film piezoelectric filter having the structure shown in FIG. 3 was prepared as follows.

The is, an procedure similar to that of Example 3 was repeated to prepare the thin film piezoelectric filter comprising a ladder type circuit except that a Ti metal layer (adhesive layer) and an Au metal layers (main electrode layer) were deposited as a lower electrode in this order to form an Au/Ti lower electrode 15 having a material and thickness described in Table 1, a ZnO piezoelectric thin film having a thickness described in Table 2 was formed on an insulating layer 13 on which the Au/Ti lower electrode 15 was deposited by an RF magnetron sputtering method on conditions described in Table 1 using ZnO as a target, an Au upper electrode 17 constituted of two electrode portions 17A, 17B having a thickness described in Table 1 was formed as an upper electrode, and a diaphragm 23 was formed into a rectangular shape based on the planar shape of a via hole fabricated by deep RIE. The above-described D1/D0 of the present example was 0.20. The value of this ratio D1/D0 indicates that of representative one set of electrically connected adjacent thin film piezoelectric resonators, but the value of the ratio D1/D0 was in a range of 0.18 to 0.3 also with respect to another set of electrically connected adjacent thin film piezoelectric resonators. Tapered angle or club-shaped angles of side wall surfaces of all via holes were in a range of 80 to 100° with respect to the upper surface of the substrate.

With respect to the thin film piezoelectric filter manufactured by the above-described steps and constituted of the ladder type circuit having the structure of FIG. 3, the degree of crystal orientation of the AlN thin film was evaluated in the same manner as in Example 3. The evaluation results are shown in Table 1.

Moreover, an impedance characteristic and pass band characteristic of the signal of the thin film piezoelectric filter comprising the ladder type circuit were measured using a microwave in the same manner as in Example 3. An electromechanical coupling coefficient $K_t^2$ and an acoustic quality factor Q were obtained from measured values of a resonant frequency fr and antiresonant frequency fa, and performances (pass bandwidth, insertion loss, attenuation amount at inhibition region) of the filter were evaluated. A basic frequency of thickness vibration, the electromechanical coupling coefficient $K_t^2$, and the acoustic quality factor Q of the obtained thin film piezoelectric filter are as shown in Table 2. Furthermore, the pass bandwidth, insertion loss I. L., and attenuation amount at inhibition region of the filter are as shown in Table 2.

Example 9

In the present example, a thin film piezoelectric filter having a structure similar to that shown in FIG. 1 was prepared as follows.

That is, an procedure similar to that of Example 3 was repeated to prepare the thin film piezoelectric filter comprising a ladder type circuit except that an $SiN_x$ layer was deposited at 800° C. by a low-pressure CVD method using mono silane ($SiH_4$) and ammonia ($NH_3$) as raw materials instead of an $SiO_2$ layer formed by a thermal oxidation method, a main electrode layer of a lower electrode was changed to a TZM alloy layer from Mo, an intermediate layer of the lower electrode was changed to Pt from Au and a Mo (TZM alloy)/Pt/Ti lower electrode 15 having a material and thickness described in Table 1 was deposited, a main electrode layer of an upper electrode was changed to a TZM alloy layer from Mo, a Ti adhesive layer was used and a Mo (TZM alloy)/Ti upper electrode 17 having a material and thickness described in Table 1 was deposited, a diaphragm 23 was formed into a rectangular shape based on the planar shape of a via hole fabricated by deep RIE, and arrangement of FBARs each constituting the thin film piezoelectric filter was changed to a lattice type circuit from a ladder type circuit. The above-described D1/D0 of the present example was 0.19. The value of this ratio D1/D0 indicates that of representative one set of electrically connected adjacent thin film piezoelectric resonators, but the value of the ratio D1/D0 was in a range of 0.18 to 0.3 also with respect to another set of electrically connected adjacent thin film piezoelectric resonators. Tapered angle or club-shaped angles of side wall surfaces of all via holes were in a range of 80 to 100° with respect to the upper surface of the substrate.

With respect to the thin film piezoelectric filter manufactured by the above-described steps and constituted of the lattice type circuit, the degree of crystal orientation of the AlN thin film was evaluated in the same manner as in Example 3. The evaluation results are shown in Table 1.

Moreover, an impedance characteristic between electrode terminals 15b, 17b of the FBAR constituting the thin film piezoelectric filter comprising the lattice type circuit was measured using a microwave prober and a network analyzer manufactured by Cascade Microtech Inc. An electromechanical coupling coefficient $K_t^2$ and an acoustic quality factor Q were obtained from measured values of a resonant frequency fr and antiresonant frequency fa. A basic frequency of thickness vibration, the electromechanical coupling coefficient $K_t^2$, and the acoustic quality factor Q of the obtained thin film piezoelectric filter are as shown in Table 2.

Furthermore, pass band characteristic of a signal of the thin film piezoelectric filter comprising the lattice type circuit was measured using a microwave prober and a network analyzer manufactured by Cascade Microtech Inc., and performances (pass bandwidth, insertion loss, attenuation amount at inhibition region) of the filter were evaluated. The pass bandwidth, insertion loss I. L., and attenuation amount at inhibition region of the obtained thin film piezoelectric filter are as shown in Table 2.

Example 10

In the present example, a duplexer in which a thin fit piezoelectric filter for transmission and a thin film piezoelectric filter for reception each having a structure (the diaphragm 23 was trapezoidal) shown in FIG. 2 are combined with a 90 degree phase matching unit was prepared as follows.

That is, an procedure similar to that of Example 1 was repeated to prepare the thin film piezoelectric filters for transmission and reception constituted of ladder type circuits except that an adhesive layer, an intermediate layer, and a main electrode layer described in Table 1 were deposited as a lower electrode in this order to form a Mo/Au/Zr lower electrode 15 having a material and thickness described in Table 1, a Mo/Zr upper electrode 17 having a material and thickness described in Table 1 was deposited as an upper electrode, and the shape of a diaphragm 23 was formed into a trapezoidal shape based on the planar shape of a via hole fabricated by deep RIE. Next, these thin film piezoelectric filters were connected to each other via the 90 degree phase matching unit, and the duplexer shown in FIG. 10 was prepared.

Figure 10:
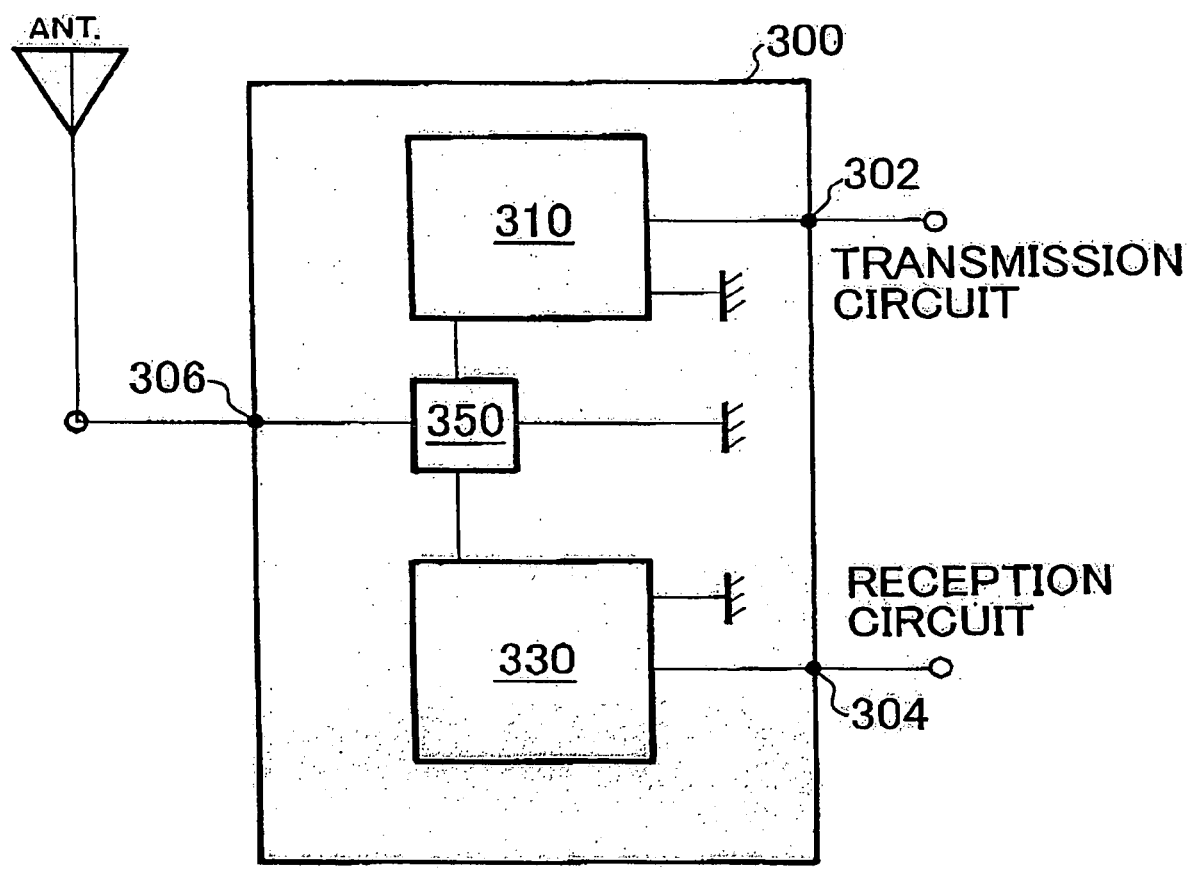
FIG. 10 is a block diagram showing a constitution of a duplexer according to the present invention.

In FIG. 10, a duplexer 300 includes a transmission thin film piezoelectric filter 310, a reception thin film piezoelectric filter 330, and a 90 degree phase matching unit 350. One end of the transmission thin film piezoelectric filter 310 is connected to a transmission port 302, and one end of the reception thin film piezoelectric filter 330 is connected to a reception port 304. The other ends of the transmission thin film piezoelectric filter 310 and the reception thin film piezoelectric filter 330 are connected to an antenna port 306 which is a port both for transmission/reception via the 90 degree phase matching unit 350. That is, the 90 degree phase matching unit 350 is connected to the antenna port 306, the transmission thin film piezoelectric filter 310, and the reception thin film piezoelectric filter 330, respectively. The transmission port 302 is connected to a transmission circuit, the reception port 304 is connected to a reception circuit, and the antenna port 306 is connected to an antenna ANT. The transmission thin film piezoelectric filter 310 and the reception thin film piezoelectric filter 330 have chip-like configurations, and are mounted on a substrate on which the 90 degree phase matching unit 350 and a desired wire-bonding are formed.

The above-described D1/D0 of the present example was 0.19. The value of this ratio D1/D0 indicates that of representative one set of electrically connected adjacent thin film piezoelectric resonators, but the value of the ratio D1/D0 was in a range of 0.18 to 0.3 also with respect to another set of electrically connected adjacent thin film piezoelectric resonators. Tapered angle or club-shaped angles of side wall surfaces of all via holes were in a range of 80 to 100° with respect to the upper surface of the substrate.

With respect to the thin film piezoelectric filter constituting the duplexer manufactured by the above-described steps and constituted of the ladder type circuit having the structure (the diaphragm 23, was trapezoidal) of FIG. 2, the degree of crystal orientation of the AlN thin film was evaluated in the same manner as in Example 1. The evaluation results are shown in Table 1.

Moreover, a resonant frequency fr, an antiresonant frequency fa, an electromechanical coupling coefficient $K_t^2$, and an acoustic quality factor Q of the thin film piezoelectric filter constituting the duplexer and constituted of the above-described ladder type circuit were obtained using a microwave prober and a network analyzer manufactured by Cascade Microtech Inc. in the same manner as in Example 1. A basic frequency of thickness vibration, the electromechanical coupling coefficient $K_t^2$, and the acoustic quality factor Q of the obtained thin film piezoelectric filter are as shown in Table 2.

Furthermore, pass band characteristic of a signal of the thin film piezoelectric filter constituting the duplexer and constituted of the above-described ladder type circuit was measured in the same manner as in Example 1, and performances (pass bandwidth insertion loss, attenuation amount at inhibition region) of the filter were evaluated. The pass bandwidth, insertion loss I. L., and attenuation amount at inhibition region of the obtained thin film piezoelectric filter are as shown in Table 2.

Examples 11, 12

In the present examples, a thin film piezoelectric filter having a structure shown in FIG. 1 was prepared as follows.

That is, an procedure similar to that of Example 9 was repeated to prepare the thin film piezoelectric filter comprising a ladder type circuit except that an adhesive layer, an intermediate layer, and a main electrode layer described in Table 1 were deposited as a lower electrode in this order to form a lower electrode 15 having a material and thickness described in Table 1 and made of Pt/Ti or W/Al/Ni, a PZT (Pb(Zr, Ti)O$_3$) piezoelectric thin film or an AlN piezoelectric thin film having a thickness described in Table 2 was formed on an insulating layer 13 on which the Pt/Ti or W/Al/Ni lower electrode 15 was deposited by an RF magnetron sputtering method or a reactive RF magnetron sputtering method on conditions described in Table 1, and an upper electrode 17 having a thickness described in Table 1 and made of Pt/Ti or Al was formed as an upper electrode. The above-described D1/D0 of the present example is as shown in Table 2. The value of this ratio D1/D0 indicates that of representative one set of electrically connected adjacent thin film piezoelectric resonators, but the value of the ratio D1/D0 was in a range of 0.18 to 0.3 also with respect to another set of electrically connected adjacent thin film piezoelectric resonators. Tapered angle or club-shaped angles of side wall surfaces of all via holes were in a range of 80 to 100° with respect to the upper surface of the substrate.

With respect to the thin film piezoelectric filter manufactured by the above-described steps and constituted of the ladder type circuit having the structure of FIG. 1, the degree of crystal orientation of the AlN thin film was evaluated in the same manner as in Example 3. The evaluation results are shown in Table 1.

Moreover, an impedance characteristic and pass band characteristic of a signal of the thin film piezoelectric filter comprising the ladder type circuit were measured using a microwave prober and a network analyzer manufactured by Cascade Microtech Inc. in the same manner as in Example 3, and an electromechanical coupling coefficient $K_t^2$ and an acoustic quality factor Q were obtained from measured values of a resonant frequency fr and an antiresonant frequency fa. Moreover, performances (pass bandwidth, insertion loss, attenuation amount at inhibition region) of the filter were evaluated. A basic frequency of thickness vibration, the electromechanical coupling coefficient $K_t^2$, and the acoustic quality factor Q of the obtained thin film piezoelectric filter are as shown in Table 2. The pass bandwidth, insertion loss I. L., and attenuation amount at inhibition region of the filter are as shown in Table 2.

Example 13

In the present example, a thin film piezoelectric filter having a structure shown in FIG. 1 was prepared as follows.

That is, an procedure similar to that of Example 3 was repeated to prepare the thin film piezoelectric filter comprising a ladder type circuit except that an Nb metal layer (adhesive layer), a Pt metal layer(intermediate layer), and a W—Mo alloy layer (main electrode layer) were deposited as a lower electrode in this order to form a W—Mo alloy/Pt/Nb lower electrode 15 having a material and thickness described in Table 1, and an aluminum nitride-gallium nitride based solid solution (Al$_{1-x}$Ga$_x$N) having a thickness described in Table 2 was formed on an insulating layer 13 on which the W—Mo alloy/Pt/Nb lower electrode 15 was deposited by a reactive RF magnetron sputtering method on conditions described in Table 1, a W—Mo alloy/Nb upper electrode 17 having a material and thickness described in Table 1 was formed as an upper electrode, and a diaphragm 23 was formed into a rectangular shape based on the planar shape of a via hole fabricated by deep RIE. The above-described D1/D0 of the present example was 0.20. The value of this ratio D1/D0 indicates that of representative one set of electrically connected adjacent thin film piezoelectric resonators, but the value of the ratio D1/D0 was in a range of 0.18 to 0.3 also with respect to another set of electrically connected adjacent thin film piezoelectric resonators. Tapered angle or club-shaped angles of side wall surfaces of all via holes were in a range of 80 to 100° with respect to the upper surface of the substrate.

With respect to the thin film piezoelectric filter manufactured by the above-described steps and constituted of the ladder type circuit having the structure of FIG. 1, the degree of crystal orientation of the AlN thin film was evaluated in the same manner as in Example 3. The evaluation results are shown in Table 1.

Moreover, an impedance characteristic and pass band characteristic of a signal of the thin film piezoelectric filter comprising the ladder type circuit were measured using a microwave prober and a network analyzer manufactured by Cascade Microtech Inc. in the same manner as in Example 3, and an electromechanical coupling coefficient $K_t^2$ and an acoustic quality factor Q were obtained from measured values of a resonant frequency fr and an antiresonant frequency fa. Moreover, performances (pass bandwidth, insertion loss, attenuation amount at inhibition region) of the filter were evaluated. A basic frequency of thickness vibration, the electromechanical coupling coefficient $K_t^2$, and the acoustic quality factor Q of the obtained thin film piezoelectric filter are as shown in Table 2. The pass bandwidth, insertion loss I. L., and attenuation amount at inhibition region of the filter are as shown in Table 2.

Figure 7A:
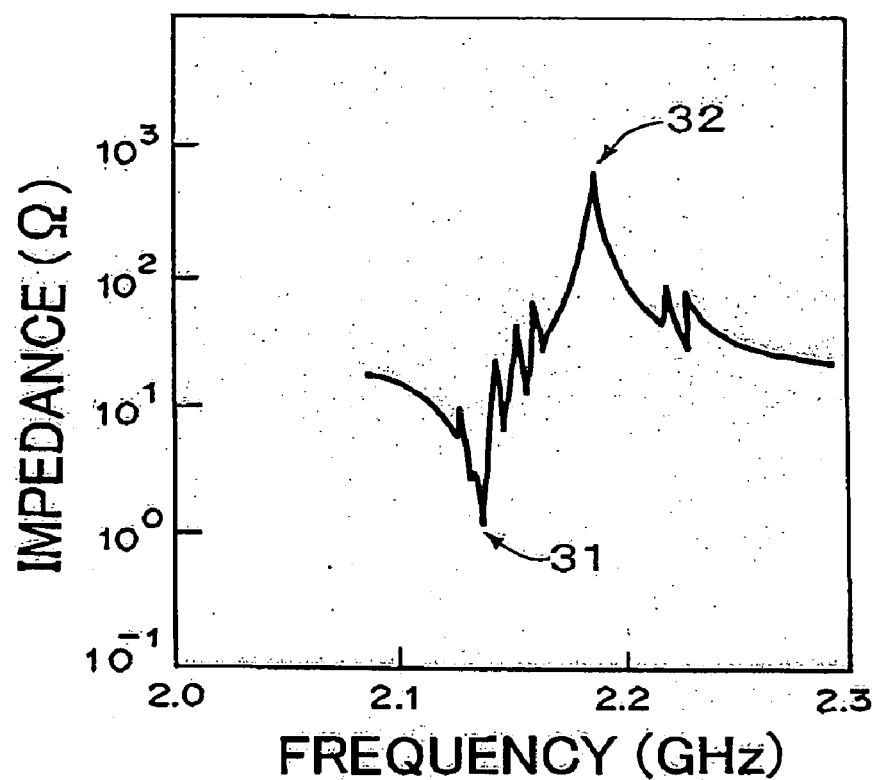
FIG. 7A is a graph showing an impedance frequency characteristic of the thin film piezoelectric device of Example 13.
Figure 7B:
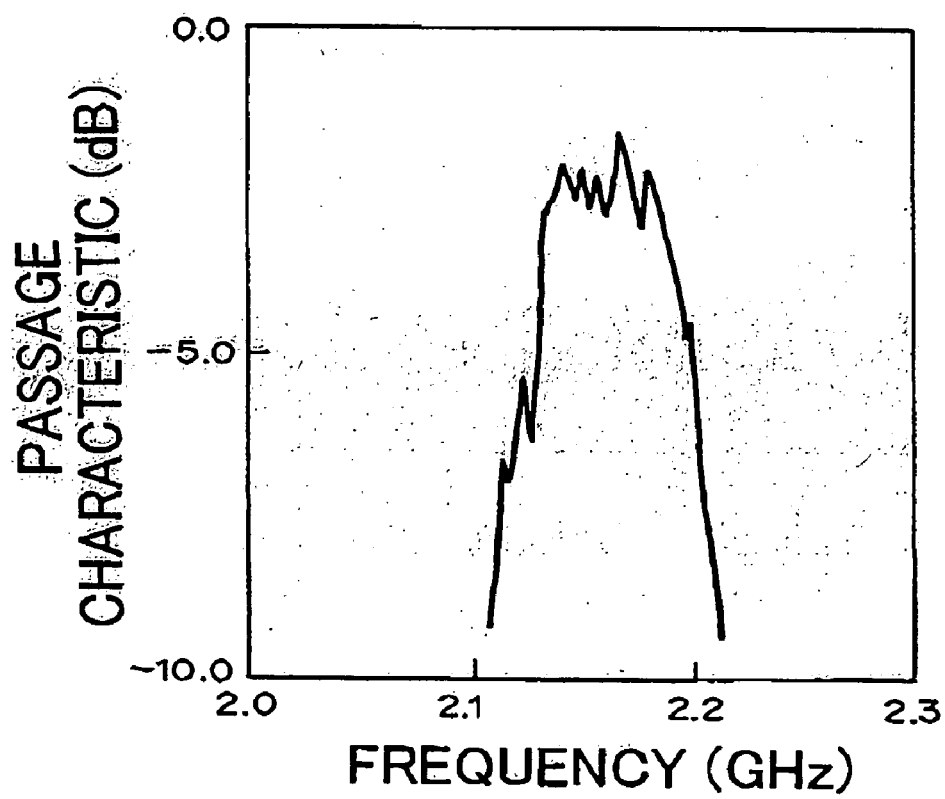
FIG. 7B is a graph showing the filter pass band characteristic of the thin film piezoelectric device of Example 13.

FIGS. 7A and 7B show the impedance frequency characteristic and filter pass band characteristic of the thin film piezoelectric device in Example 13. As seen when comparing FIGS. 6A and 6 (Example 6) with FIGS. 7A and 7B (present example), in FIG. 7A of the present example, many fine peaks exist between a resonant frequency peak 31 and an antiresonant frequency peak 32. On the other hand, in FIG. 6A of Example 6, there is remarkably few fine peaks between the resonant frequency peak 31 and the antiresonant frequency peak 32. Therefore, as seen when comparing the filter pass band characteristic of FIG. 6B with that of FIG. 7B, the pass band characteristic of the thin film piezoelectric filter of Example 6 is more satisfactory. A difference between the pass band characteristics mainly depends on the diaphragm shape, and it is indicate that an asymmetric pentangular shape is more preferable than a rectangular shape.

Example 14

In the present example, a thin film piezoelectric filter having a structure shown in FIG. 2 was prepared as follows.

That is, an procedure similar to that of Example 1 was repeated to prepare the thin film piezoelectric filter comprising a ladder type circuit except that an adhesive layer and a main electrode layer described in Table 1 were deposited as a lower electrode in this order to form a Pt/Hf lower electrode 15 having a material and thickness described in Table 1, a Pt upper electrode 17 having a thickness described in Table 1 was formed as an upper electrode, and a ZnO piezoelectric thin film having a thickness described in Table 2 was deposited as a piezoelectric film on conditions described in Table 1 by an RF magnetron sputtering method using ZnO as a target. The above-described D1/D0 of the present example was 0.20. The value of this ratio D1/D0 indicates that of representative one set of electrically connected adjacent thin film piezoelectric resonators, but the value of the ratio D1/D0 was in a range of 0.18 to 0.3 also with respect to another set of electrically connected adjacent thin film piezoelectric resonators. Tapered angle or club-shaped angles of side wall surfaces of all via holes were in a range of 80 to 100° with respect to the upper surface of the substrate.

With respect to the thin film piezoelectric filter manufactured by the above-described steps and constituted of the ladder type circuit having the structure of FIG. 2, the degree of crystal orientation of the AlN thin film was evaluated in the same manner as in Example 1. The evaluation results are shown in Table 1.

Moreover, an impedance characteristic and pass band characteristic of a signal of the thin film piezoelectric filter comprising the ladder type circuit were measured using a microwave prober and a network analyzer manufactured by Cascade Microtech Inc. in the same manner as in Example 1, and an electromechanical coupling coefficient $K_t^2$ and an acoustic quality factor Q were obtained from measured values of a resonant frequency fr and an antiresonant frequency fa. Moreover, performances (pass bandwidth, insertion loss, attenuation amount at inhibition region) of the filter were evaluated. A basic frequency of thickness vibration, the electromechanical coupling coefficient $K_t^2$, and the acoustic quality factor Q of the obtained thin film piezoelectric filter are as shown in Table 2. The pass bandwidth, insertion loss I. L., and attenuation amount at inhibition region of the filter are as shown in Table 2

Comparative Example 1

In the present comparative example, a thin film piezoelectric filter having a structure (a diaphragm 23 was trapezoidal) shown in FIGS. 1A to 1C was prepared as follows.

That is, an procedure similar to that of Example 3 was repeated to prepare the thin film piezoelectric filter comprising a ladder type circuit except that an Ni metal layer (adhesive layer) and a Mo—Re alloy layer (main electrode layer) were deposited as a lower electrode in this order to form a Mo—Re alloy/Ni lower electrode 15 having a material and thickness described in Table 1, an AlN thin film having a thickness described in Table 2 was formed on an insulating layer 13 on which the Mo—Re alloy/Ni lower electrode 15 was deposited by a reactive RF magnetron sputtering method on conditions described in Table 1, and a Mo—Re upper electrode 17 having a material and thickness described in Table 1 was formed as an upper electrode. The above-described D1/D0 of the present comparative example was 0.55. The value of this ratio D1/D0 indicates that of representative one set of electrically connected adjacent thin film piezoelectric resonators, but the value of the ratio D1/D0 was in a range of 0.5 to 0.6 also with respect to another set of electrically connected adjacent thin film piezoelectric resonators.

With respect to the thin film piezoelectric filter manufactured by the above-described steps and constituted of the ladder type circuit having the structure (the diaphragm 23 was trapezoidal) of FIG. 1, the degree of crystal orientation of the AlN thin film was evaluated in the same manner as in Example 3. The evaluation results are shown in Table 1.

Moreover, an impedance characteristic and pass band characteristic of a signal of the thin film piezoelectric filter comprising the ladder type circuit were measured using a microwave prober and a network analyzer manufactured by Cascade Microtech Inc. in the same manner as in Example 3, and an electromechanical coupling coefficient $K_t^2$ and an acoustic quality factor Q were obtained from measured values of a resonant frequency fr and an antiresonant frequency fa. Moreover, performances (pass bandwidth, insertion loss, attenuation amount at inhibition region) of the filter were evaluated. A basic frequency of thickness vibration, the electromechanical coupling coefficient $K_t^2$, and the acoustic quality factor Q of the obtained thin film piezoelectric filter are as shown in Table 2. The pass bandwidth, insertion loss I. L., and attenuation amount at inhibition region of the filter are as shown in Table 2.

Comparative Examples 2, 3

In the present comparative examples, a thin film piezoelectric filter having a structure shown in FIGS. 8A and 8B was prepared as follows.

That is, after forming $SiO_2$ layers each having a thickness of 1.0 μm on opposite upper/lower surfaces of a (100) Si substrate 12 having a thickness of 300 μM at 1100° C. by a thermal oxidation method, the only $SiO_2$ layer on the upper surface was etched to adjust the thickness of the $SiO_2$ layer on the upper surface, and an insulating layer 13 made of $SiO_2$ and having a thickness value described in Table 1 was formed. An adhesive layer and a main electrode layer described in Table 1 were deposited on the upper surface of the insulating layer 13 in this order by a DC magnetron sputtering method, and the layers were pattered into a desired shape by photolithography to form a Mo/Ti or Au/Ti lower electrode 15. A main body portion 15a of the lower electrode 15 was formed into a nearly rectangular shape whose each side was larger than that of the diaphragm 23 by about 40 μm. It was confirmed by X-ray diffraction measurement that the Mo metal layer was a (110) oriented film, that is, a singly oriented film. An AlN piezoelectric thin film or a ZnO piezoelectric thin film having a thickness described in Table 2 was formed on the insulating layer 13 on which the Mo lower electrode 15 was deposited on conditions described in Table 1 by a reactive RF magnetron sputtering method using metal Al as a target or by an RF magnetron sputtering method using ZnO as a target. The AlN film was patterned into a specific shape by wet etching using hot phosphoric acid, or the ZnO film was patterned into a predetermined shape by wet etching using a phosphoric acid-hydrochloric acid mixed aqueous solution, and an AlN or ZnO piezoelectric film 16 was formed.

Thereafter, an upper electrode 17 having a main body portion 17a having a shape close to a rectangular shape whose each side was smaller than that of the diaphragm 23 by about 5 μm and made of Mo/Ti or Au was formed in a material and thickness described in Table 1 using the DC magnetron sputtering method and a lift-off process. The main body portion 17a of the upper electrode 17 was disposed in a position corresponding to the lower electrode main body portion 15a.

The 1.0 μm thick $SiO_2$ layer formed on the lower surface of the Si substrate 12 on which a piezoelectric laminated structure 14 constituted of the lower electrode 15, upper electrode 17, and piezoelectric film 16 was formed as described above was patterned by the photolithography, and a mask for wet etching was prepared. The piezoelectric laminated structure 14 formed on the upper surface of the Si substrate 12 was coated with a protective wax, and a portion of the Si substrate 12 corresponding to the diaphragm 23 was etched/removed by heated KOH using the $SiO_2$ mask formed on the lower surface to prepare via holes 22 constituting gaps. As a result, the planar dimension of the diaphragm was around 150 μm×150 μm or 160 μm×160 μm, and the via hole was obtained in which the planar dimension of the opening in the substrate back surface was 575 μm×575 μm or 585 μm×585 μm. The above-described D1/D0 of the present comparative examples is as shown in Table 2. The value of this ratio D1/D0 indicates that of representative one set of electrically connected adjacent thin film piezoelectric resonators, but the value of the ratio D1/D0 was in a range of 0.7 to 0.8 also with respect to another set of electrically connected adjacent thin film piezoelectric resonators.

With respect to the thin film piezoelectric filter manufactured by the above-described steps and constituted of the ladder type circuit having the structure of FIGS. 8A and 8B, the degree of crystal orientation of the AlN thin film was evaluated in the same manner as in Example 3. The evaluation results are shown in Table 1.

Moreover, an impedance characteristic and pass band characteristic of a signal of the above-described thin film piezoelectric filter comprising the ladder type circuit were measured using a microwave prober and a network analyzer manufactured by Cascade Microtech Inc. in the same manner as in Example 3, and an electromechanical coupling coefficient $K_r^2$ and an acoustic quality factor Q were obtained from measured values of a resonant frequency fr and antiresonant frequency fa. Moreover, performances (pass bandwidth, insertion loss, attenuation amount at inhibition region) of the filter were evaluated. A basic frequency of thickness vibration, the electromechanical coupling coefficient $K_r^2$, and the acoustic quality factor Q of the obtained thin film piezoelectric filter are as shown in Table 2. The pass bandwidth, insertion loss I. L., and attenuation amount at inhibition region of the filter are as shown in Table 2.

Comparative Example 4

In the present comparative example, preparation of a thin film piezoelectric filter having a structure shown in FIG. 2 was tried in such a manner that the above-described D1/D0 was 0.095.

That is, an procedure similar to that of Example 1 was repeated to try to prepare the thin film piezoelectric filter comprising a ladder type circuit except that a Zr metal layer (adhesive layer), an Au metal layer (intermediate layer), and a Mo metal layer (main electrode layer) were deposited as a lower electrode in this order to form a Mo/Au/Zr lower electrode 15 having a material and thickness described in Table 1, and a Mo upper electrode 17 having a thickness described in Table 1 was formed as an upper electrode. However, a dimension D1 corresponding to a width of a support area existing between adjacent diaphragms was small, therefore a substrate was broken during working such as dicing or chip forming, and it was not possible to form the thin film piezoelectric filter into a device. Therefore, it was not possible to evaluate characteristics of an FBAR or a filter.

With respect to a sample from which the preparation of the thin film piezoelectric filter was tried by the above-described steps, the degree of crystal orientation of the AlN thin film was evaluated in the same manner as in Example 1. The evaluation results are shown in Table 1.

INDUSTRIAL APPLICABILITY

As described above, according to the present invention, a substrate portion present under a portion constituting a vibration portion is anisotropically removed from the lower surface of a substrate by a deep graving type reactive ion etching (deep RIE) process which is deep trench etching utilizing plasma, and accordingly a via hole which enables a small difference between a dimension of a diaphragm and that of a lower surface opening of the substrate can be prepared. Accordingly, a distance between diaphragm centers of the adjacent thin film piezoelectric resonators of a thin film piezoelectric device, which are electrically connected to each other by a metal electrode, is shortened, and an insertion loss attributable to a conductor loss of a metal electrode can be remarkably reduced.

According to a thin film piezoelectric device of the present invention, the distance between the diaphragm centers of the electrically connected adjacent thin film piezoelectric resonators is short, and a plurality of thin film piezoelectric resonators disposed in vicinity positions are combined and integrated. Accordingly, the insertion loss attributable to the conductor loss of the metal electrode can be remarkably reduced, and a thin film piezoelectric device ran be realized having a low insertion loss and having superior electromechanical coupling coefficient or acoustic quality factor (Q). A planar shape of the diaphragm constituting the vibration portion of the thin film piezoelectric resonator is devised and optimized. Accordingly, there can be obtained a thin film piezoelectric device having a low insertion loss and superior pass band characteristics, in which any extra spurious signal or noise does not enter a pass band. When the thin film piezoelectric device of the present invention is used, the insertion loss is small, and the pass band characteristics are superior. Therefore, a performance of a thin film piezoelectric oscillator (VCO), a filter, or a duplexer is enhanced, and the present invention can be utilized as various devices for mobile communication apparatuses.

The invention claimed is:

1. A thin film piezoelectric device including a substrate having a plurality of vibration spaces and a piezoelectic laminated structure formed on the substrate, a plurality of thin film piezoelectric resonators being formed facing the vibration spaces, wherein the piezoelectric laminated structure has at least a piezoelectric film and a metal electrode formed on at least a part of each of opposite surfaces of the piezoelectric film, the piezoelectric laminated structure comprises diaphragms positioned facing the vibration spaces, and a support area other than the diaphragms, at least one set of two adjacent thin film piezoelectric resonators are electrically connected to each other through the metal electrode, the thin film piezoelectric device comprising at least one set of two adjacent thin film piezoelectric resonators in which D0 is a distance between the centers of the diaphragms of the two electrically connected adjacent thin film piezoelectric resonators and D1 is a length of a segment of a support area on a straight line passing through centers of the diaphragms of two electrically connected adjacent thin film piezoelectric resonators, and a ratio D1/D0 is 0.1 to 0.5.

2. The thin film piezoelectric device according to claim 1, wherein the ratio D1/D0 is in a range of 0.1 to 0.5 with respect to all the sets of two electrically connected adjacent thin film piezoelectric resonators.

3. The thin film piezoelectric device according to claim 1, wherein each of the vibration spaces is formed by a via hole extending from the surface of the substrate on which the piezoelectric laminated structure is formed to the opposite surface, and a side wall surface of the via hole forms a slant angle in a range of 80 to 100.degree. with respect to the surface of the substrate on which the piezoelectric laminated structure is formed.

4. The thin film piezoelectric device according to claim 1, wherein the piezoelectric laminated structure comprises a lower electrode constituting the metal electrode, the piezoelectric film, and an upper electrode constituting the metal electrode stacked in order from the substrate side in at least one thin film piezoelectric resonator.

5. The thin film piezoelectric device according to claim 4, wherein the upper electrode of the at least one thin film piezoelectric resonator comprises two electrode portions.

6. The thin film piezoelectric device according to claim 1, wherein the piezoelectric laminated structure comprises a lower electrode constituting the metal electrode, a first piezoelectric film, an inner electrode constituting the metal electrode, a second piezoelectric film, and an upper electrode constituting the metal electrode stacked in order from the substrate side in at least one thin film piezoelectric resonator.

7. The thin film piezoelectric device according to claim 1, wherein at least one insulating layer of silicon oxide and/or silicon nitride and/or aluminum nitride as a main component is attached to the diaphragm.

8. The thin film piezoelectric device according to claim 1, wherein an insulating layer comprising at least one layer of silicon oxide and/or silicon nitride and/or aluminum nitride as a main component intervenes only between the support area of the piezoelectric laminated structure and the substrate.

9. The thin film piezoelectric device according to claim 1, wherein the piezoelectric film is an oriented crystal film represented by a general formula $Al_{1-x}Ga_xN$ (where $0<x<1$) and consists of a solid solution of aluminum nitride and gallium nitride showing a c-axis orientation, and a rocking curve half value width (FWHM) of a diffraction peak of a (0002) surface of the film is 3.0.degree. or less in at least one thin film piezoelectric resonator.

10. The thin film piezoelectric device according to claim 1, wherein the piezoelectric film is a zinc oxide thin film showing a c-axis orientation, and a rocking curve half value Width (FWM) of a diffraction peak of a (0002) surface of the film is 3.0.degree. or less in at least one thin film piezoelectric resonator.

11. The thin film piezoelectric device according to claim 1, wherein the piezoelectric film is a lead titanate thin film or a lead zirconate titanate thin film in at least one thin film piezoelectric resonator.

12. The thin film piezoelectric device according to claim 1, wherein the planar shape of one of the diaphragms has two pairs of opposite sides, and at least one pair of opposite sides is formed to be non-parallel in at least one thin film piezoelectric resonator.

13. The thin film piezoelectric device according to claim 1, wherein at least a part of the planar shape of one of the diaphragms is formed by a non-square irregular polygonal shape in at least one thin film piezoelectric resonator.

14. The thin film piezoelectric device according to claim 1, wherein the planar shape of one of the diaphragms is formed, by a non-square irregular polygonal shape including a curved portion in at least a part of the shape in at least one thin film piezoelectric resonator.

15. The thin film piezoelectric device according to claim 1, the thin film piezoelectric device being a thin film piezoelectric filter.

16. The thin film piezoelectric device according to claim 15, wherein the thin film piezoelectric filter comprises a ladder type circuit comprising a plurality of thin film piezoelectric resonators connected in series and at least one of the thin film piezoelectric resonators branched from/connected to the plurality of resonators connected in series.

17. The thin film piezoelectric device according to claim 1, the thin film piezoelectric device being a duplexer comprising a plurality of thin film piezoelectric filters.

18. The thin film piezoelectric device according to claim 17, wherein the thin film piezoelectric filter comprises a ladder type circuit comprising a plurality of thin film piezoelectric resonators connected in series and at least one of the thin film piezoelectric resonators branched from/connected to the plurality of resonators connected in series.

19. A method of manufacturing the thin film piezoelectric device according to claim 1, comprising the steps of: forming the piezoelectric laminated structure on the substrate comprising a semiconductor or an insulator; and thereafter forming the vibration spaces in the substrate from a side opposite to the side on which the piezoelectric laminated structure is fabricated by a deep graving type reactive ion etching process.

20. The thin film piezoelectric device according to claim 2, wherein the ratio D1/D0 is in a range of 0.18 to 0.3 with respect to all the sets of two electrically connected-adjacent thin film piezoelectric resonators.

21. The thin film piezoelectric device according to claim 7, wherein assuming that a thickness of the piezoelectric film is t, and a thickness of the insulating layer is t', $0.1 \leq t'/t \leq 0.5$ is satisfied.

22. The thin film piezoelectric device according to claim 1, wherein at least one of metal electrodes comprises a main electrode layer and an adhesive layer.

23. The thin film piezoelectric device according to claim 1, wherein a thickness of the piezoelectric film is in a range of 0.98 to 1.57 .mu.m.

24. The thin film piezoelectric device according to claim 1, wherein the piezoelectric laminated structure comprises a lower electrode constituting the metal electrode, the piezoelectric film, and an upper electrode constituting the metal electrode stacked in order from the substrate side, and a total of thicknesses of the lower electrode and the upper electrode is in a range of 320 to 485 nm.

25. The thin film piezoelectric device according to claim 24, wherein a thickness of the lower electrode is in a range of 170 to 235 nm.

26. The thin film piezoelectric device according to claim 24, wherein a thickness of the upper electrode is in a range of 150 to 250 nm.

27. The thin film piezoelectric device according to claim 1, wherein the piezoelectric laminated structure comprises a lower electrode constituting the metal electrode, the piezoelectric film, and an upper electrode constituting the metal electrode stacked in order from the substrate side, and a ratio of a total of thicknesses of the lower electrode and the upper electrode to a thickness of the piezoelectric film is in a range of 0.255 to 0.392.

28. The thin film piezoelectric device according to claim 22, wherein the piezoelectric laminated structure comprises a lower electrode constituting the metal electrode, the piezoelectric film, and an upper electrode constituting the metal electrode stacked in order from the substrate side, and a ratio of a total of thicknesses of the lower electrode and the upper electrode to a thickness of the piezoelectric film is in a range of 0.255 to 0.452.

29. A thin film piezoelectric device including a substrate having a plurality of vibration spaces, an insulating layer formed on an upper surface of the substrate, a piezoelectric laminated structure formed on an upper surface of the insulating layer, diaphragms positioned facing the vibration spaces, and a support area in which the piezoelectric laminated structure and the insulating layer are supported by the substrate, a plurality of thin film piezoelectric resonators being formed facing the vibration spaces, wherein the piezoelectric laminated structure has at least a piezoelectric film and a metal electrode formed on at least a part of each of the opposite surfaces of the piezoelectric film, each diaphragm comprises a portion of the piezoelectric laminated structure and a portion of the insulating layer, and a support area comprises another portion of the piezoelectric laminated structure and at least a portion of the insulating layer, and wherein at least one set of two adjacent thin film piezoelectric resonators are electrically connected to each other through the metal electrode, the thin film piezoelectric device comprising at least one set of two adjacent thin film piezoelectric resonators in which D0 is a distance between the centers of the diaphragms of the two electrically connected adjacent thin film piezoelectric resonators and D1 is a length of a segment of the support area on a straight line passing through centers of the diaphragms of two electrically connected adjacent thin film piezoelectric resonators, and a ratio D1/D0 is 0.1 to 0.5.

30. The thin film piezoelectric device according to claim 29, wherein the ratio D1/D0 is in a range of 0.1 to 0.5 with respect to all the sets of two electrically connected adjacent thin film piezoelectric resonators.

31. The thin film piezoelectric device according to claim 29, wherein each of the vibration spaces is formed by a via hole extending from the surface of the substrate on which the insulating layer is formed to the opposite surface, and a side wall surface of the via hole forms a slant angle in a range of 80 to 100° with respect to the surface of the substrate on which the insulating layer is formed.

32. The thin film piezoelectric device according to claim 29, wherein the piezoelectric laminated structure comprises a lower electrode constituting the metal electrode, the piezoelectric film, and an upper electrode constituting the metal electrode stacked in order from the insulating layer side in at least one thin film piezoelectric resonator.

33. The thin film piezoelectric device according to claim 32, wherein the upper electrode of the at least one thin film piezoelectric resonator comprises two electrode portions.

34. The thin film piezoelectric device according to claim 29, wherein the piezoelectric laminated structure comprises a lower electrode constituting the metal electrode, a first piezoelectric film, an inner electrode constituting the metal electrode, a second piezoelectric film, and an upper electrode constituting the metal electrode stacked in order from the insulating layer side in at least one thin film piezoelectric resonator.

35. The thin film piezoelectric device according to claim 29, wherein the insulating layer comprises at least one layer of silicon oxide and/or silicon nitride and/or aluminum nitride as a main component.

36. The thin film piezoelectric device according to claim 29, wherein the piezoelectric film is an oriented crystal film represented by a general formula $Al_{1-x}Ga_xN$ (where $0<x<1$) and consists of a solid solution of aluminum nitride and gallium nitride showing a c-axis orientation, and a rocking curve half value width (FWHM) of a diffraction peak of a (0002) surface of the film is 3.0° or less in at least one thin film piezoelectric resonator.

37. The thin film piezoelectric device according to claim 29, wherein the piezoelectric film is a zinc oxide thin film showing a c-axis orientation, and a rocking curve half value width (FWHM) of a diffraction peak of a (0002) surface of the film is 3.0° or less in at least one thin film piezoelectric resonator.

38. The thin film piezoelectric device according to claim 29, wherein the piezoelectric film is a lead titanate thin film or a lead zirconate titanate thin film in at least one thin film piezoelectric resonator.

39. The thin film piezoelectric device according to claim 29, wherein the planar shape of one of the diaphragms has two pairs of opposite sides, and at least one pair of opposite sides is formed to be non-parallel in at least one thin film piezoelectric resonator.

40. The thin film piezoelectric device according to claim 29, wherein at least a part of the planar shape of one of the diaphragms is formed by a non-square irregular polygonal shape in at least one thin film piezoelectric resonator.

41. The thin film piezoelectric device according to claim 29, wherein, the planar shape of one of the diaphragms is formed by a non-square irregular polygonal shape including a curved portion in at least a part of the shape in at least one thin film piezoelectric resonator.

42. The thin film piezoelectric device according to claim 29, the thin film piezoelectric device being a thin film piezoelectric filter.

43. The thin film piezoelectric device according to claim 42, wherein the thin film piezoelectric filter comprises a ladder type circuit comprising a plurality of thin film piezoelectric resonators connected in series and at least one of the thin film piezoelectric resonators branched from/connected to the plurality of resonators connected in series.

44. The thin film piezoelectric device according to claim 29, the thin film piezoelectric device being a duplexer comprising a plurality of thin film piezoelectric filters.

45. The thin film piezoelectric device according to claim 44, wherein the thin film piezoelectric filter comprises a ladder type circuit comprising a plurality of thin film piezoelectric resonators connected in series and at least one of the thin film piezoelectric resonators branched from/connected to the plurality of resonators connected in series.

46. A method of manufacturing the thin film piezoelectric device according to claim 29, comprising the steps of forming the insulating layer on the substrate comprising a semiconductor or an insulator; forming the piezoelectric laminated structure on the insulating layer; and thereafter forming the vibration spaces in the substrate from a side opposite to the side on which the insulating layer is form by a deep graving type reactive ion etching process.

47. The thin film piezoelectric device according to claim 30, wherein the ratio D1/D0 is in a range of 0.18 to 0.3 with respect to all the sets of two electrically connected adjacent thin film piezoelectric resonators.

48. The thin film piezoelectric device according to claim 29, wherein assuming that a thickness of the piezoelectric film is t, and a thickness of the insulating layer is t', $0.1 \leq t'/t \leq 0.5$ is satisfied.

49. The thin film piezoelectric device according to claim 29, wherein at least one of metal electrodes comprises a main electrode layer and. an adhesive layer.

50. The thin film piezoelectric device according to claim 29, wherein a thickness of the piezoelectric film is in a range of 0.98 to 1.57 μm.

51. The thin film piezoelectric device according to claim 29, wherein the piezoelectric laminated structure comprises a lower electrode constituting the metal electrode, the piezoelectric film, and an upper electrode constituting the metal electrode stacked in order from the insulating layer side, and a total of thicknesses of the lower electrode and the upper electrode is in a range of 320 to 485 nm.

52. The thin film piezoelectric device according to claim 51, wherein a thickness of the lower electrode is in a range of 170 to 235 nm.

53. The thin film piezoelectric device according to claim 51, wherein a thickness of the upper electrode is in a range of 150 to 250 nm.

54. The thin film piezoelectric device according to claim 29, wherein the piezoelectric laminated structure comprises a lower electrode constituting the metal electrode, the piezoelectric film, and an upper electrode constituting the metal electrode stacked in order from the insulating layer side, and a ratio of a total of thicknesses of the lower electrode and the upper electrode to a thickness of the piezoelectric film is in a range of 0.255 to 0.392.

55. The thin film piezoelectric device according to claim 49, wherein the piezoelectric laminated structure comprises a lower electrode constituting the metal electrode, the piezoelectric film, and an upper electrode constituting the metal electrode stacked in order from the insulating layer side, and a ratio of a total of thicknesses of the lower electrode and the upper electrode to a thickness of the piezoelectric film is in a range of 0.255 to 0.452.

* * * * *